US012701980B2

(12) United States Patent
Hsiao et al.

(10) Patent No.: US 12,701,980 B2
(45) Date of Patent: Aug. 4, 2026

(54) LAYER-BY-LAYER FORMATION OF THROUGH-SUBSTRATE VIA

(71) Applicant: Taiwan Semiconductor Manufacturing Company, Ltd., Hsin-Chu (TW)

(72) Inventors: Tsung-Chieh Hsiao, Changhua County (TW); Ke-Gang Wen, Hsinchu (TW); Liang-Wei Wang, Hsinchu City (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 542 days.

(21) Appl. No.: 18/192,799

(22) Filed: Mar. 30, 2023

(65) Prior Publication Data
US 2024/0120257 A1 Apr. 11, 2024

Related U.S. Application Data

(60) Provisional application No. 63/413,909, filed on Oct. 6, 2022.

(51) Int. Cl.
*H10W 20/20* (2026.01)
*H10W 20/00* (2026.01)
(Continued)

(52) U.S. Cl.
CPC ......... *H10W 20/20* (2026.01); *H10W 20/023* (2026.01); *H10W 20/43* (2026.01);
(Continued)

(58) Field of Classification Search
CPC ............. H01L 23/481; H01L 21/76898; H01L 23/528; H01L 24/05; H01L 24/06; H01L 24/13; H01L 21/76807; H01L 2224/05567; H01L 2224/0557; H01L 2224/05624; H01L 2224/05647; H01L 2224/05657;
(Continued)

(56) References Cited

U.S. PATENT DOCUMENTS 8,802,504 B1   8/2014   Hou et al.
8,803,292 B2   8/2014   Chen et al.
(Continued)

FOREIGN PATENT DOCUMENTS

TW   202230530 A   8/2022
TW   202230740 A   8/2022

*Primary Examiner* — Patricia D Valenzuela
(74) *Attorney, Agent, or Firm* — HAYNES AND BOONE, LLP

(57) ABSTRACT

An integrated circuit (IC) device includes a substrate. The IC device includes a multi-layer interconnect structure disposed over a first side of the substrate. The multi-layer interconnect structure includes a plurality of metal layers. The IC device includes a first portion of a through-substrate via (TSV) disposed over the first side of the substrate. The first portion of the TSV includes a plurality of conductive components belonging to the plurality of metal layers of the multi-layer interconnect structure. The IC device includes a second portion of the TSV that extends vertically through the substrate from the first side to a second side opposite the first side. The second portion of the TSV is electrically coupled to the first portion of the TSV.

20 Claims, 21 Drawing Sheets

(51) Int. Cl.

| | |
|---|---|
| *H10W 20/43* | (2026.01) |
| *H10W 72/20* | (2026.01) |
| *H10W 72/90* | (2026.01) |

(52) U.S. Cl.

CPC ........ *H10W 20/084* (2026.01); *H10W 72/242* (2026.01); *H10W 72/9415* (2026.01); *H10W 72/942* (2026.01); *H10W 72/944* (2026.01); *H10W 72/952* (2026.01)

(58) Field of Classification Search

CPC . H01L 2224/05676; H01L 2224/06181; H01L 2224/13021; H10W 20/20; H10W 20/023; H10W 20/43; H10W 20/084; H10W 72/242; H10W 72/9415; H10W 72/942; H10W 72/944; H10W 72/952; H10W 20/0234; H10W 20/0242; H10W 72/20; H10W 72/90

See application file for complete search history.

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2015/0093858 A1* | 4/2015 | Hwang | H01L 21/561 |
| | | | 438/113 |
| 2016/0238793 A1* | 8/2016 | Frankel | G02B 6/14 |
| 2022/0277998 A1 | 9/2022 | Kao | |
| 2022/0302019 A1 | 9/2022 | Chen | |

* cited by examiner (Top View)

(Top View)

(Top View)

(Top View)

(Top View)

(Top View)

Via layer

Metal layer

Y
X

Metal layer
Via layer (Top View)

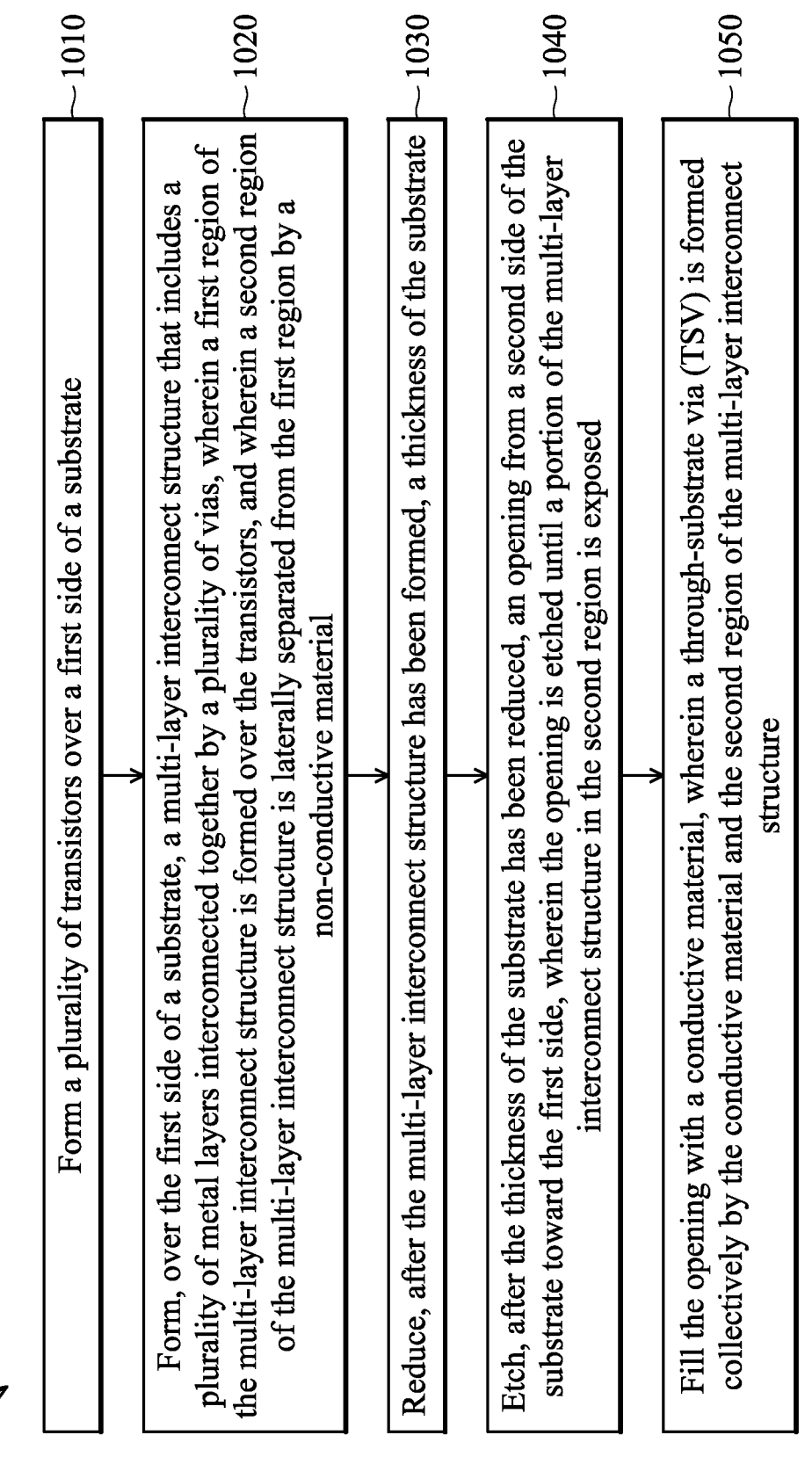

1000

1010 — Form a plurality of transistors over a first side of a substrate

1020 — Form, over the first side of a substrate, a multi-layer interconnect structure that includes a plurality of metal layers interconnected together by a plurality of vias, wherein a first region of the multi-layer interconnect structure is formed over the transistors, and wherein a second region of the multi-layer interconnect structure is laterally separated from the first region by a non-conductive material 1030 — Reduce, after the multi-layer interconnect structure has been formed, a thickness of the substrate 1040 — Etch, after the thickness of the substrate has been reduced, an opening from a second side of the substrate toward the first side, wherein the opening is etched until a portion of the multi-layer interconnect structure in the second region is exposed 1050 — Fill the opening with a conductive material, wherein a through-substrate via (TSV) is formed collectively by the conductive material and the second region of the multi-layer interconnect structure

FIG. 20

LAYER-BY-LAYER FORMATION OF THROUGH-SUBSTRATE VIA

PRIORITY INFORMATION

This application claims the priority to U.S. Provisional Application Ser. No. 63/413,909, filed Oct. 6, 2022, entitled "Layer-By-Layer Formation of Through-Substrate Via," the disclosure of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, it has become more difficult to fabricate IC device without performance degradations. For example, IC devices may utilize a through-substrate via (TSV) to establish electrical connections. Conventional methods of fabricating TSVs may give rise to issues such as topography dishing and/or stress related to thermal expansion/contraction, which may result in performance degradations. These problems may become exacerbated as device sizes become smaller.

Therefore, although existing IC devices and their methods of fabrication have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 20 is a flowchart illustrating a method of fabricating an IC device according to various aspects of the present disclosure.

DETAILED DESCRIPTION

Figures 1A, 1B:
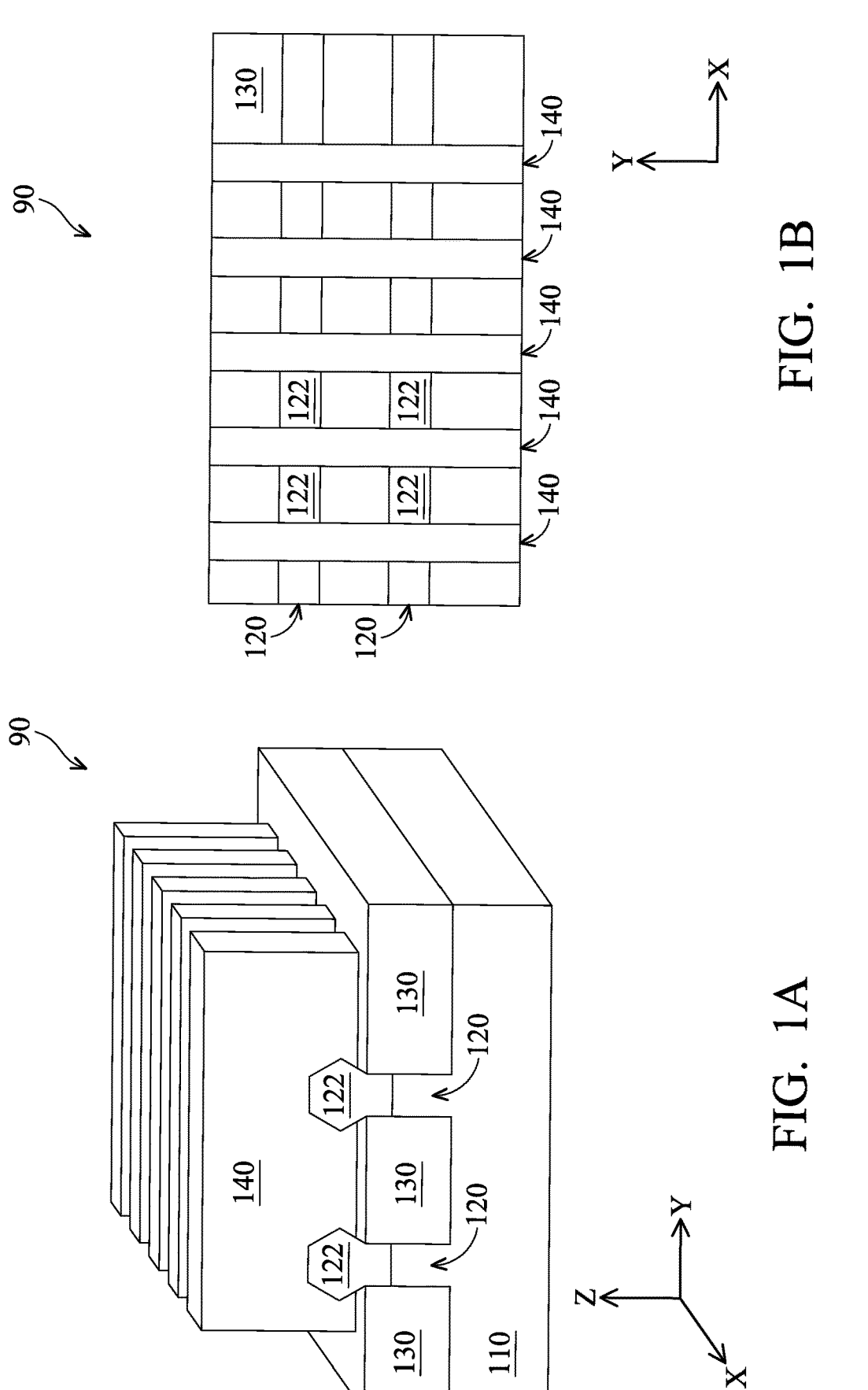
FIG. 1A illustrates a three-dimensional perspective view of a FinFET device.
FIG. 1B illustrates a top view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to forming a through-substrate via (TSV) in a manner that reduces IC performance degradations. In more detail, TSVs may be utilized in ICs to provide electrical connections between the microelectronic components of the ICs and external devices. Conventional methods of forming TSVs may etch a large opening in an empty region (e.g., away from electrical circuitry) of a wafer, and subsequently filling the opening with a conductive material. In such a TSV-formation scheme, the TSV is formed as a single block conductive structure, whose size may be large compared to its nearby components (e.g., metal lines of a multi-layer interconnect structure). However, forming such a large single block conductive structure in an empty region surrounded by other structures (e.g., the metal lines) may lead to loading issues, such as topography dishing, which may result in a less-than-optimal shape for the TSV. As such, the yield and/or performance of the IC device may be degraded. In addition, according to the conventional TSV process flow, various fabrication processes may be performed to form other microelectronic components (e.g., other interconnection components) after the formation of the TSV. However, the formation of these other microelectronic components may involve thermal processes. Therefore, the TSV may undergo thermal expansion and subsequent thermal contraction when the IC device is cooled. The thermal expansion and/or contraction may cause stress to the nearby components, which may further degrade the yield and/or performance of the IC device.

To address the issues discussed above, the present disclosure involves a process flow in which the TSV is not formed all at once, but in two separate stages using different processes. In more detail, in a first stage of the TSV formation process flow, a first portion of the TSV may be formed over a front side of a substrate using a layer-by-layer stacking approach. For example, a multi-layer interconnect structure is formed over the front side of the substrate to provide electrical connections to the electronic circuitry of the IC device. According to the present disclosure, as each metal layer of the multi-layer interconnect structure is formed, a corresponding portion thereof is formed as a part of the TSV. In other words, the formation of the multi-layer interconnect structure concurrently forms the first portion of the TSV, where the first portion of the TSV includes a plurality of metal layers that are vertically stacked over one another and interconnected by vias. Since the formation of the first portion of the TSV does not involve forming a relatively big structure in an otherwise empty region that is surrounded by other much smaller structures (e.g., metal lines of the interconnect structure), the loading effect is reduced, which alleviates the topography dishing issues that often plague the TSVs formed under conventional schemes. Furthermore, the layer-by-layer stacking approach herein can also reduce stress, since each metal layer (as a part of the first portion of the TSV) is small and therefore is associated with a reduced amount of stress.

A plurality of fabrication processes—which may involve thermal processes—may then be performed to form additional interconnection structures and insulation structures over the front side of the substrate. For example, a conductive pad (e.g., an aluminum pad) may be formed over the topmost metal layer of the first portion of the TSV, and a conductive bump may be formed over the conductive pad. The conductive pad and a part of the conductive bump may be surrounded by a non-conductive material, which helps to insulate the conductive pad and the conductive bump from other components of the IC device.

A second stage of the TSV formation process flow may be performed after these additional fabrication processes discussed above are performed. According to the second stage of the TSV formation process flow, a substrate back side thinning process is performed to reduce a thickness of the substrate. Thereafter, an opening is etched into the substrate from the back side, where the opening exposes a portion of the bottommost metal layer of the first portion of the TSV. A deposition is then performed to fill the opening with a conductive material, such as copper, cobalt, ruthenium, tungsten, etc., to form a second portion of the TSV.

Note that the formation of the second portion of the TSV according to the present disclosure helps to avoid thermal stress. This is because many of the thermal processes take place between the first stage and the second stage of the TSV formation. As such, by the time the second stage of the TSV formation is performed to form the second portion of the TSV, the thermal processes have already occurred, and therefore the second portion of the TSV will not experience the thermal expansion and/or contraction that would have occurred due to these thermal processes. Even if certain thermal processes still occur after the formation of the second portion of the TSV, the overall number of thermal processes is still reduced according to the fabrication process flow herein, which helps to reduce the thermal stress associated with the thermal expansion and/or contraction. Consequently, IC device yield and/or performance may be improved.

Figure 1C:
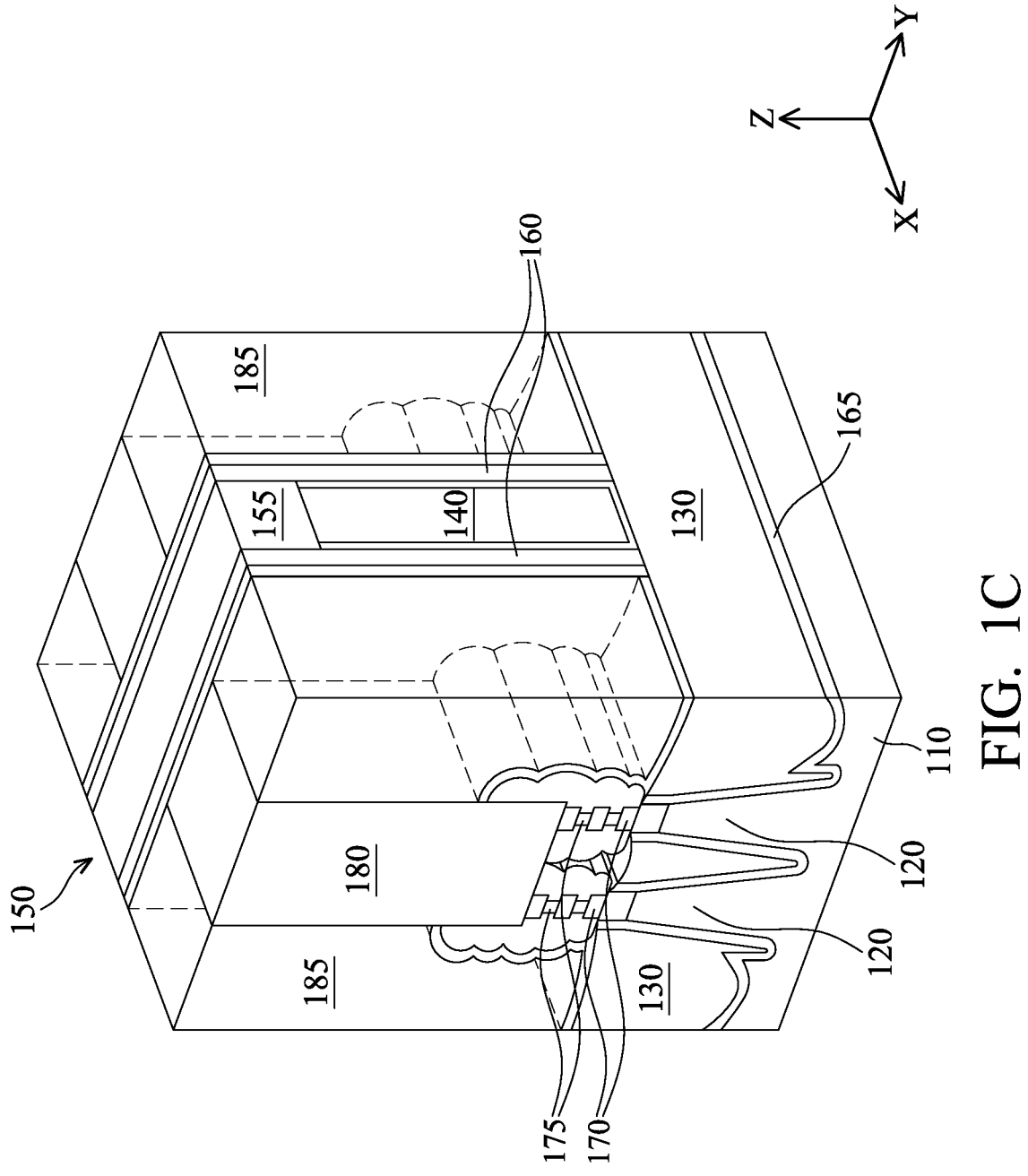
FIG. 1C illustrates a three-dimensional perspective view of a multi-channel gate-all-around (GAA) device.
Figures 17A, 17B:
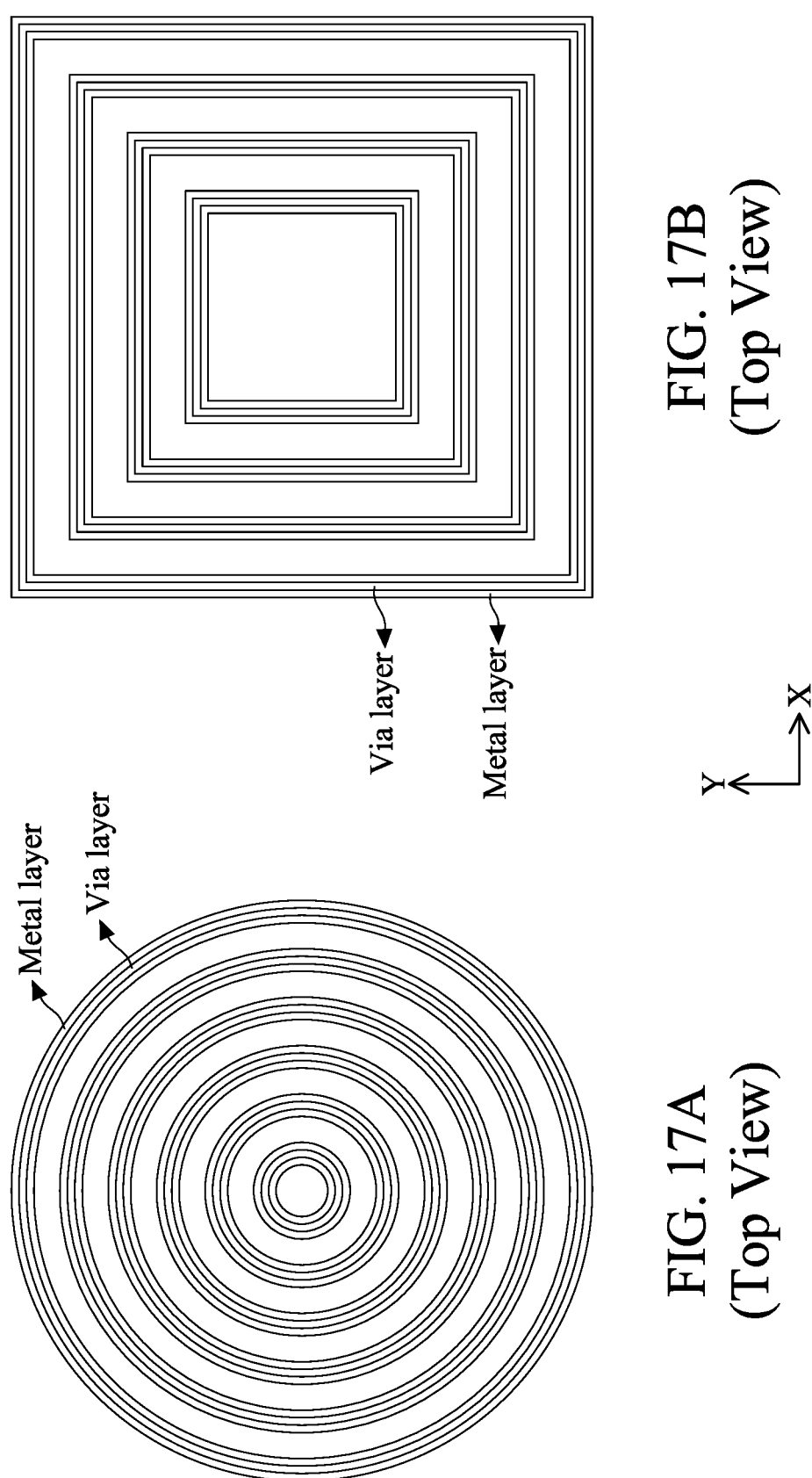
Figure 18:
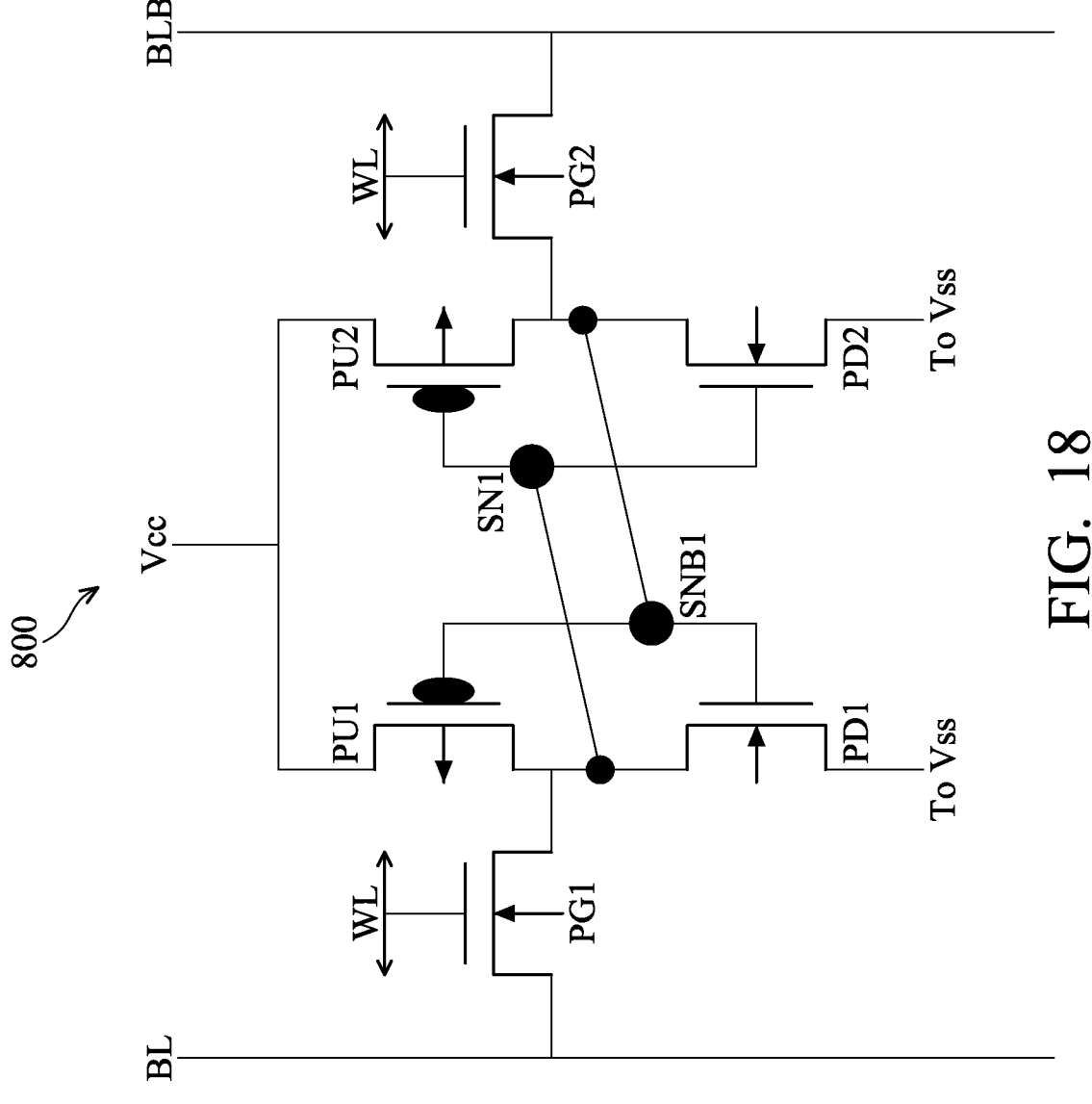
FIG. 18 illustrates a circuit diagram of a memory cell.
Figure 19:
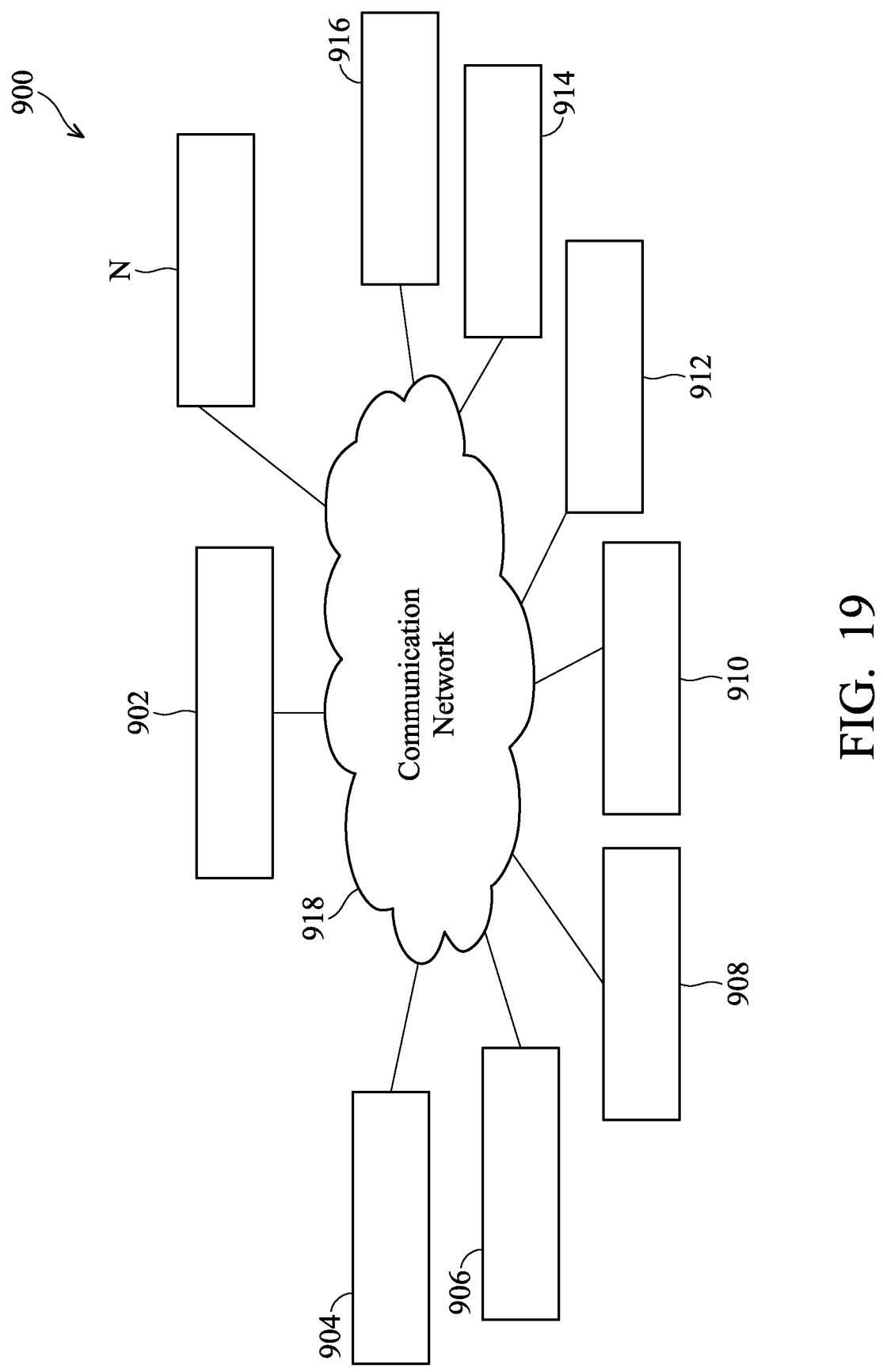
FIG. 19 illustrates an integrated circuit fabrication system according to various aspects of the present disclosure.

The various aspects of the present disclosure will now be discussed below with reference to FIGS. 1A, 1B, 1C, and 2-13, 14A-14C, 15, 16A-16B, 17A-17B, and 18-20. In more detail, FIGS. 1A-B illustrate an example FinFET device, and FIG. 1C illustrates an example GAA device. FIGS. 2-13 and 15 illustrate cross-sectional side views of an IC device at various stages of fabrication according to embodiments of the present disclosure. FIGS. 14A-14C, 16A-16B, and 17A-17B illustrate top views of a portion of a TSV of an IC device. FIG. 18 illustrates a memory circuit cell. FIG. 19 illustrates a semiconductor fabrication system. FIG. 20 illustrates a flowchart of a method of fabricating an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using field-effect transistors (FETs) such as three-dimensional fin-line FETs (FinFETs). FinFET devices have semiconductor fin structures that protrude vertically out of a substrate. The fin structures are active regions, from which source/drain region(s) and/or channel regions are formed. Source/drain region(s) may refer to a source or a drain, individually or collectively dependent upon the context. A source/drain region may also refer to a region that provides a source and/or drain for multiple devices. The gate structures partially wrap around the fin structures. In recent years, FinFET devices have gained popularity due to their enhanced performance compared to conventional planar transistors.

As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example multi-channel gate-all-around (GAA) device 150. GAA devices have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

The FinFET devices of FIGS. 1A-1B and the GAA devices of FIG. 1C may be utilized to implement electrical circuitries having various functionalities, such as memory devices (e.g., static random access memory (SRAM) devices), logic circuitries, application specific integrated circuit (ASIC) devices, radio frequency (RF) circuitries, drivers, micro-controllers, central processing units (CPUs), image sensors, etc., as non-limiting examples.

FIGS. 2-13 illustrate diagrammatic fragmentary cross-sectional views of a portion of an IC device 200 (in which the FinFET or GAA devices are implemented) at various stages of fabrication according to various embodiments of the present disclosure. In more detail, FIGS. 2-13 illustrate the cross-sectional views along an X-Z plane, and as such, FIGS. 2-13 may be referred to as X-cuts.

Figure 2:
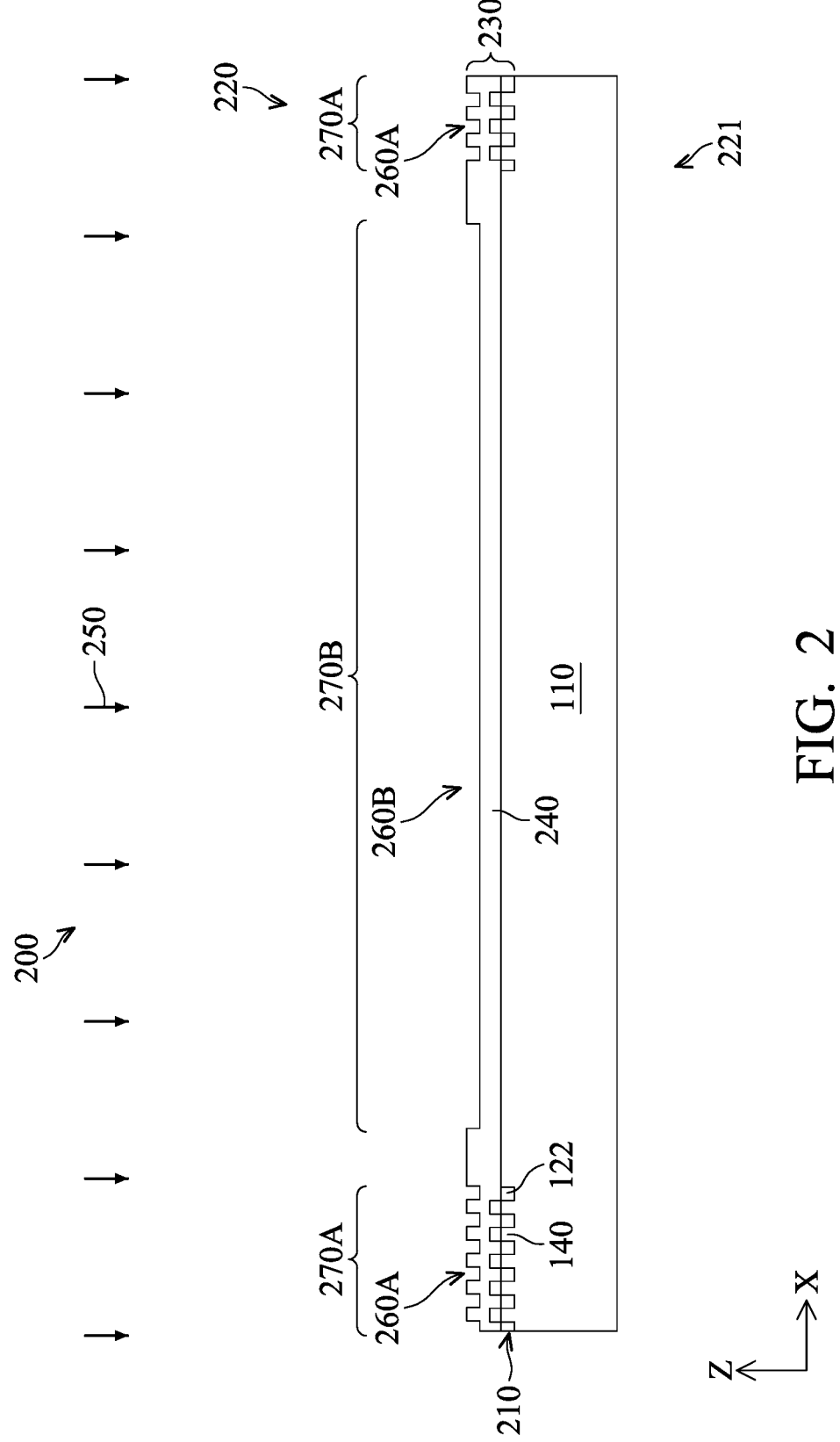
FIGS. 2-13 illustrate a series of cross-sectional views of an IC device at various stages of fabrication according to embodiments of the present disclosure.

As shown in FIG. 2, the IC device 200 includes the substrate 110 discussed above, which may comprise an elementary (single element) semiconductor, a compound semiconductor, an alloy semiconductor, and/or other suitable materials. Transistors 210 may be formed in (or over) the substrate 110. The transistors 210 may be implemented as the FinFET transistors shown in FIGS. 1B-1C and/or the GAA transistors shown in FIG. 1C. For example, the transistors 210 may include the HKMG structures 140 and the source/drain components 122 discussed above. The transistors 210 may be components of electrical circuitries of the IC device 200. For reasons of simplicity, additional details of the transistors 210 or other components of the electrical circuitries are not illustrated in FIG. 2 or the subsequent figures. The transistors 210 may be formed in or over a front side 220 of the substrate 110. In that regard, the substrate 210 (and the IC device 200) may have certain components (e.g., the transistors) formed at its front side 220, as well as other components formed in later processes at its back side 221 that is opposite the front side 220 in the Z-direction vertically.

A multi-layer interconnect structure 230 may be formed over the front side 220 of the substrate 110. At its completion, the multi-layer interconnect structure 230 may include a plurality of metal layers that include interconnection elements such as metal lines, as well as conductive vias that vertically interconnect different metal lines from different metal layers. However, at the stage of fabrication shown in FIG. 2, a Metal-0 layer (as a bottommost metal layer of the multi-layer interconnect structure 230) is undergoing its initial stage of formation, and the metal layers above the Metal-0 layer have not been formed either. In more detail, an insulating layer 240 is formed over the front side 220 of the substrate 110, including over the transistors 210. The insulating layer 240 may be formed using a deposition process, such as chemical vapor deposition (CVD), physical vapor deposition (PVD), atomic layer deposition (ALD), etc. In some embodiments, the insulating layer 240 may include a dielectric material, such as silicon oxide or silicon nitride. In other embodiments, the insulating layer 240 may include a polymer material.

One or more etching processes 250 may then be performed to the IC device 200 to etch a plurality of trenches in the insulating layer 240, such as trenches 260A and 260B (also referred to as openings 260A-260B interchangeably herein). The trenches 260A are formed in regions 270A of the IC device 200, while the trench 260B is formed in a region 270B of the IC device. In that regard, the regions 270A are regions of the IC device 200 where the transistors 210 are formed. The trenches 260A are etched so that metal lines may be formed in the trenches 260A. These metal lines will provide electrical connectivity to the transistors 210. Meanwhile, the formation of the trench 260B is one of the unique aspects of the present disclosure and is not done in conventional processes. The region 270B in which the trench 260B is formed may be substantially free of transistors 210, and the region 270B is reserved for the formation of a TSV according to the present disclosure. As will be discussed below, the trench 260B will be filled by a conductive material to form a metal line therein, which will serve as one of the components of a first portion of the TSV herein. In this manner, the region 270A corresponds to a portion of the multi-layer interconnect structure 230 that is vertically aligned with the transistors 210, whereas the region 270B corresponds to a portion of the multi-layer interconnect structure 230 that is laterally spaced apart from the transistors 210 but is vertically aligned with a second portion of a TSV that extends vertically through the substrate 110. The second portion of the TSV will be formed in a later process, as will be discussed below in greater detail.

Figure 3:
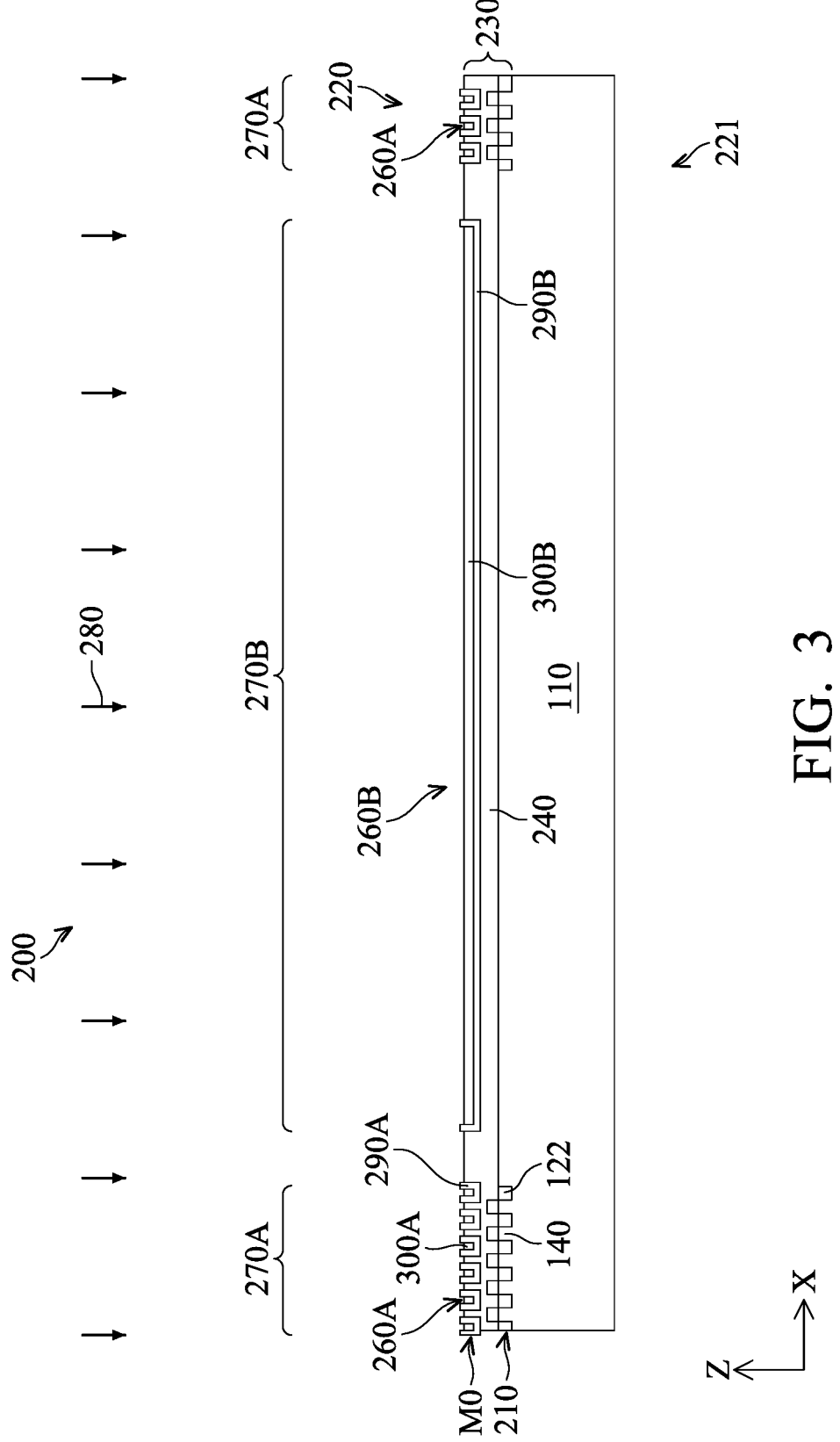

Referring now to FIG. 3, a plurality of deposition processes 280 may be performed to the IC device 200 to fill the trenches 260A and 260B with conductive materials. The deposition processes 280 may include CVD, PVD, ALD, or combinations thereof. In the illustrated embodiment, a first step of the deposition processes 280 may deposit a barrier layer 290A to partially fill each of the trenches 260A, respectively, as well as a barrier layer 290B to partially fill the trench 260B. In some embodiments, the barrier layers 290A and 290B include titanium (Ti) or titanium nitride (TiN). The barrier layers 290A and 290B are formed on the side and bottom surfaces of their respective trenches, but do not fill the trenches completely.

A second step of the deposition processes 280 may deposit a conductive material over the barrier layers 290A and 290B to completely fill the trenches 260A and 260B. The deposited conductive material may then be polished using a planarization process, such as chemical mechanical polishing (CMP) process, to remove excess portions of the deposited conductive material outside of the trenches 260A and 260B, and also to make the upper surface of the deposited conductive materials substantially coplanar with one another and with the upper surface of the insulating layer 240. Metal lines 300A and 300B are formed by the remaining portions of the deposited conductive materials filling the trenches 260A and 260B. In some embodiments, the metal lines 300A and 300B include copper. In other embodiments, the metal lines 300A and 300B may include cobalt, ruthenium, tungsten, aluminum, or combinations thereof.

At this stage, a Metal-0 layer (labeled as M0 in FIG. 3) is formed as a bottommost metal layer of the multi-layer interconnect structure 230. Such a M0 layer includes the barrier layers 290A-290B and the metal lines 300A-300B collectively. It is understood that the barrier layers 290A-290B help to prevent diffusion between the metal lines 300A-300B and the insulating layer 240, and/or between the metal lines 300A-300B and the substrate 110. It is also understood that the barrier layers 290A-290B may be considered to be parts of their respective metal lines.

Figure 4:
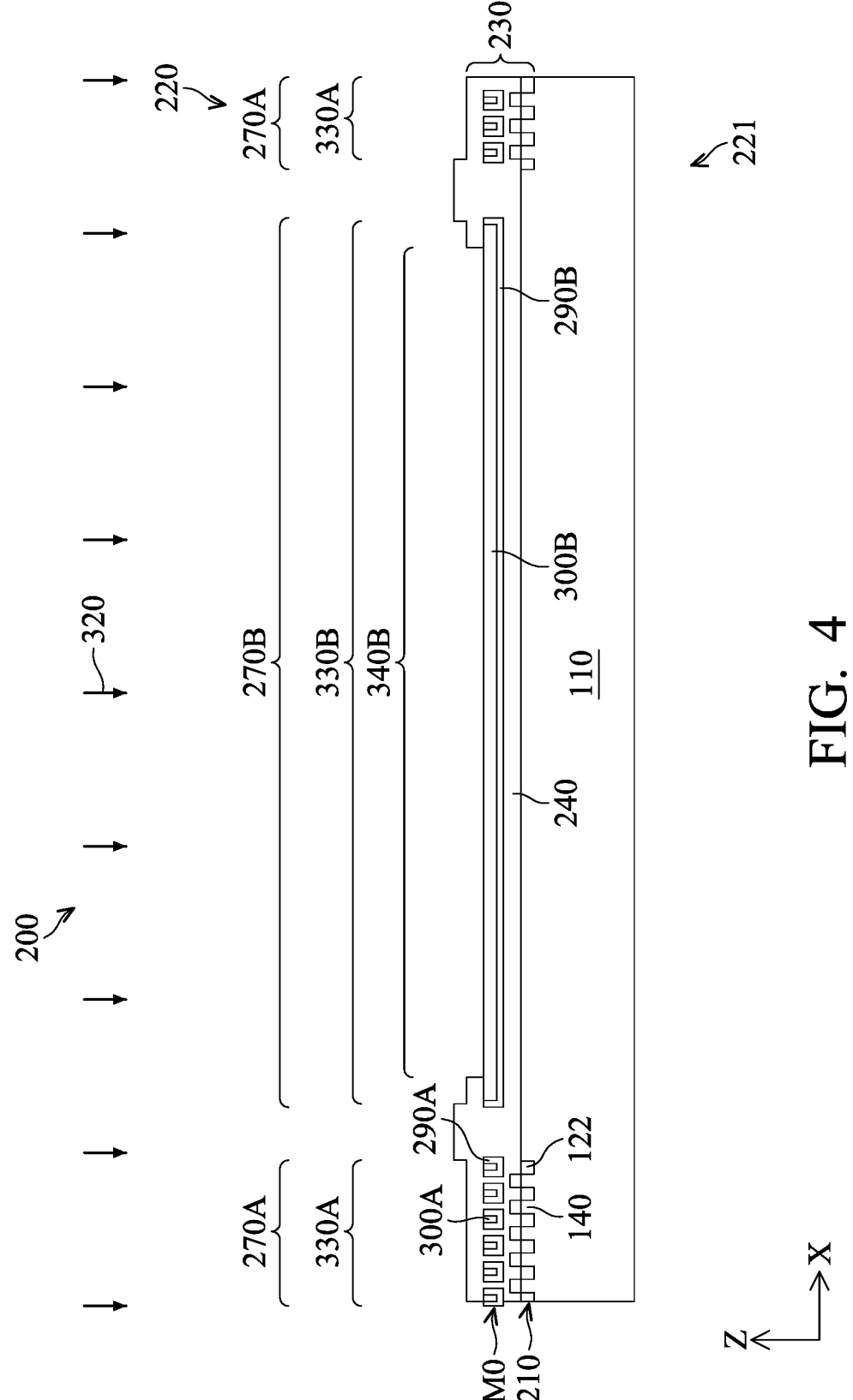

Referring now to FIG. 4, one or more deposition processes (e.g., CVD, PVD, ALD, etc.), may be performed to thicken the insulating layer 240. For example, additional portions of the insulating layer 240 are formed over the M0 layer, including over the upper surfaces of the metal lines 300A and 300B. Thereafter, one or more etching processes 320 may be performed to the IC device 200 to etch a plurality of trenches in the insulating layer 240. The etching of the trenches may be performed in two steps. In a first step of the etching processes 320, trenches 330A and 330B are etched in the region 270A and in the region 270B, respectively. These trenches 330A and 330B have a relatively shallow depth, and they do not expose the upper surfaces of the metal lines 300A and 300B therebelow. This is because the trenches 330A and 330B are reserved for the formation of metal lines, but not the vias below, as a part of a dual damascene process.

In a second step of the etching processes 320, deeper trenches are formed within the trenches 330A and 330B to further extend portions of these trenches 330A and 330B downward, until the upper surfaces of the metal lines 300A and 300B are exposed. These trenches are reserved for the formation of vias, and therefore they may also be referred to as via trenches or via holes. Note that although the via trenches may be etched in both the region 270A and 270B, the via trenches in the region 270A are not specifically illustrated in FIG. 4 for reasons of simplicity. For example, the via trenches etched in the region 270A may be located in a portion of the IC device 200 that is not located at the cross-section of FIG. 4, which is why these via trenches in the region 270A are not directly visible in FIG. 4. In comparison, the via trench formed in the region 270B is illustrated as a trench 340B. The trench 340B exposes a portion of the upper surface of the metal line 300B. Regardless of where the via trenches such as the trench 340B are formed, it is understood that the eventual conductive vias formed to fill these via trenches will be used to interconnect the M0 layer with a M1 metal layer to be formed above as a part of the dual damascene process.

Figure 5:
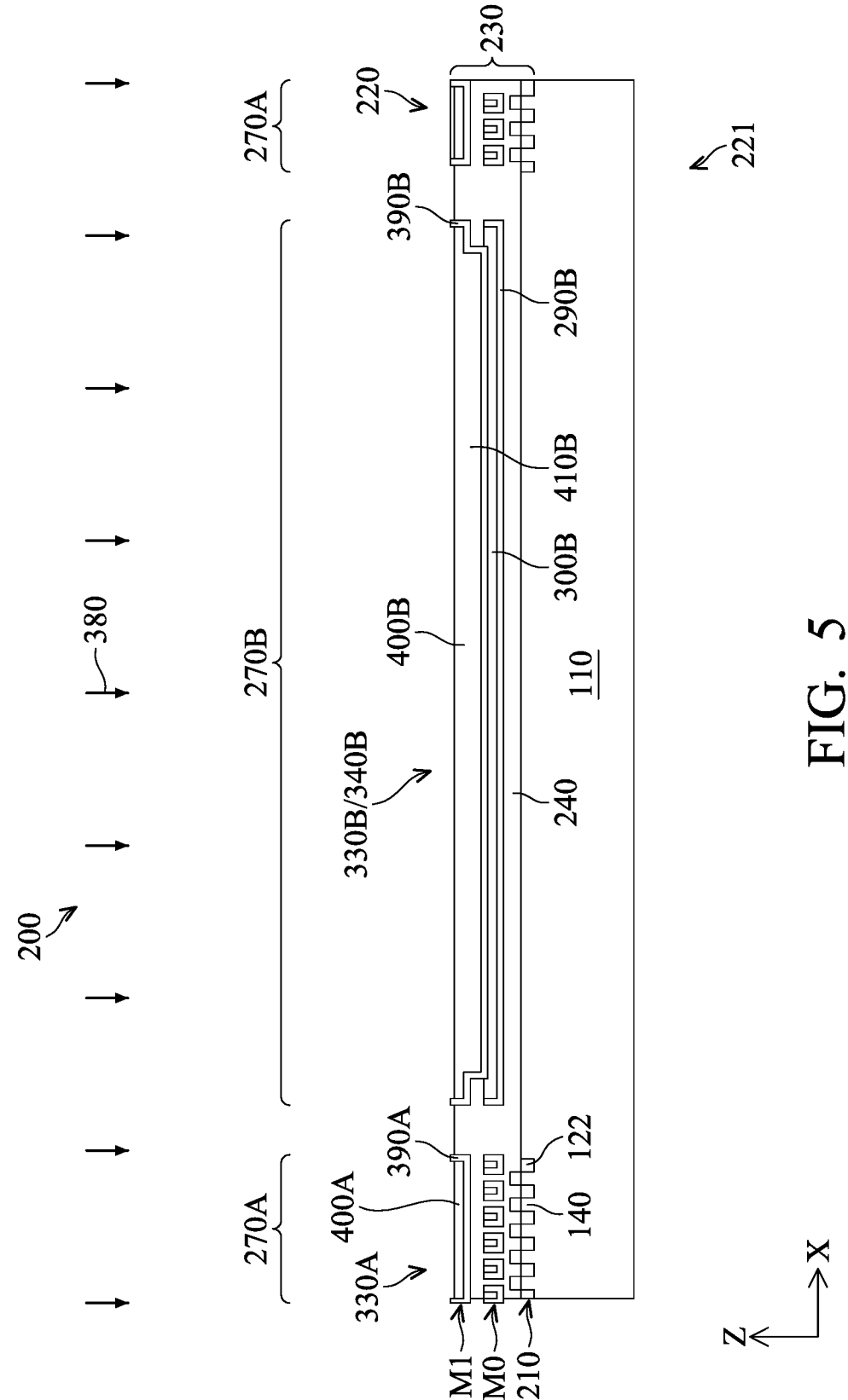

Referring now to FIG. 5, a plurality of deposition processes 380 may be performed to the IC device 200 to fill the trench 330B/340B in the region 270B (as well as the unillustrated trenches in the region 270A) with conductive materials as a part of the dual damascene process. As was the case for the deposition processes 280, the deposition processes 380 may perform a first step to form barrier layers 390A and 390B in the trenches 330A and 330B/340B, respectively, and then perform a second step to form metal lines 400A and 400B over the barrier layers 390A and 390B, respectively. Note that the second step of the deposition processes 380 forms not just the metal lines 400A and 400B, but also the conductive vias therebelow, such as a via 410B below the metal line 400B. In other words, the via 410B and the metal line 400B are formed using the same deposition process and have the same material compositions (e.g., copper, cobalt, ruthenium, tungsten, aluminum, etc.). Also note that since the location of the via trenches in the region 270A are not directly visible in FIG. 5, the resulting conductive vias formed in the region 270A are not directly visible in FIG. 5 either, though it is understood that the conductive vias in the region 270A are also formed at the same time as the conductive via 410B through the same fabrication processes.

Based on the above discussions, it can be seen that a Metal-1 layer (labeled as M1 in FIG. 5) is formed over the Metal-0 layer through the dual damascene process. The resulting Metal-1 layer includes the barrier layers 390A-390B and the metal lines 400A-400B collectively, and it is interconnected to the Metal-0 layer by the unillustrated conductive vias in the region 270A and by the conductive via 410B in the region 270B. It is understood that although the conductive vias (e.g., the conductive via 410B) have been referred as components external to the Metal-1 layer, they may also be considered as components belonging to the Metal-1 layer in some cases. In other words, the Metal-1 layer (and the additional metal layers to be formed thereabove) may be considered to include the metal lines but not the vias in some cases, or they may be considered to include both the metal lines as well as the vias in other cases.

Figure 6:
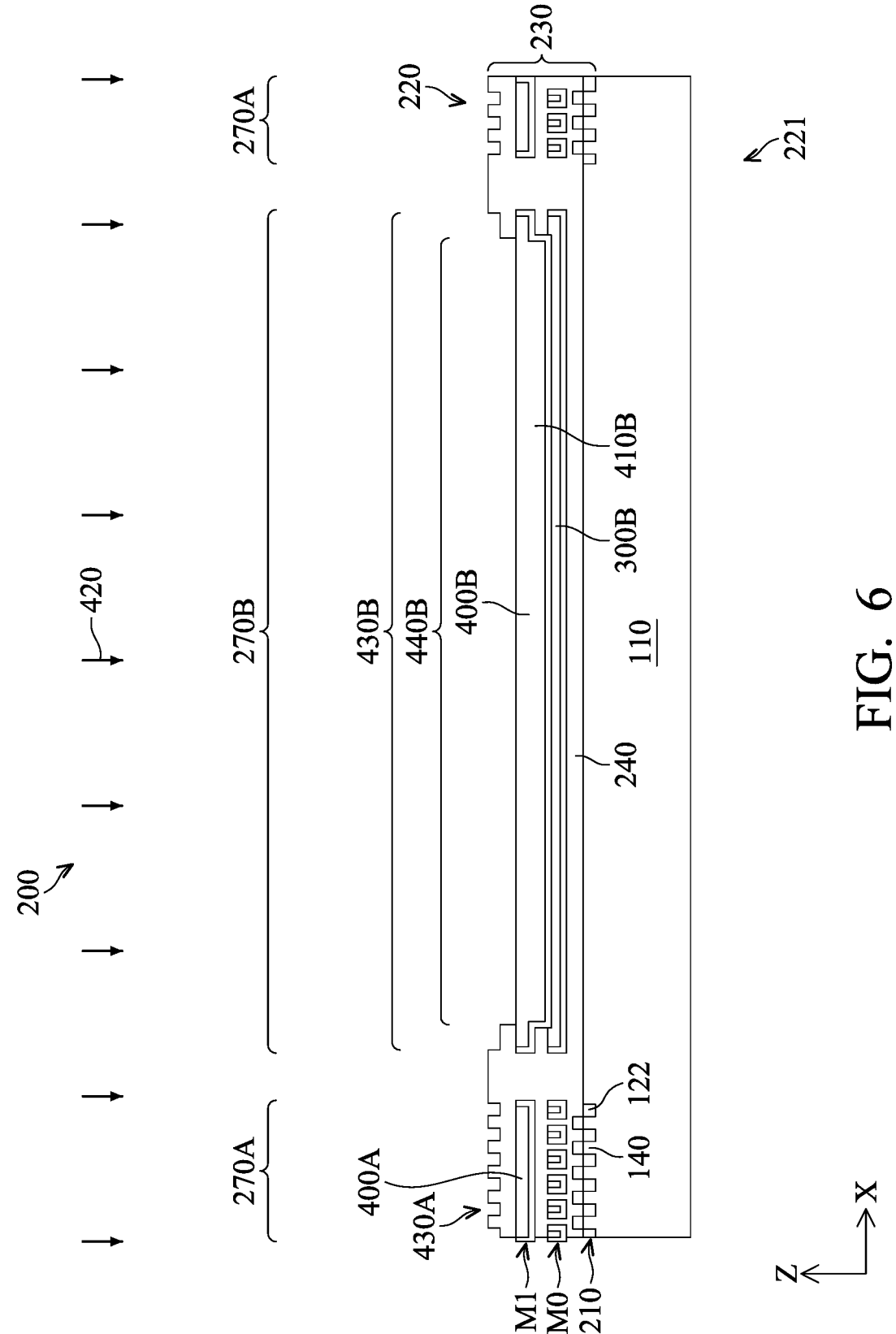

Referring now to FIG. 6, one or more deposition processes (e.g., CVD, PVD, ALD, etc.), may be performed to further thicken the insulating layer 240. For example, additional portions of the insulating layer 240 are formed over the M1 layer, including over the upper surfaces of the metal lines 400A and 400B. Thereafter, one or more etching processes 420 may be performed to the IC device 200 to etch a plurality of trenches in the insulating layer 240. The etching of the trenches may be performed in two steps. In a first step of the etching processes 420, trenches 430A and 430B are etched in the region 270A and in the region 270B, respectively. These trenches 430A and 430B have a relatively shallow depth, and they do not expose the upper surfaces of the metal lines 400A and 400B therebelow. This is because the trenches 430A and 430B are reserved for the formation of metal lines, but not the vias below, as a part of a dual damascene process.

In a second step of the etching processes 420, deeper trenches are formed within the trenches 430A and 430B to further extend portions of these trenches 430A and 430B downward, until the upper surfaces of the metal lines 400A and 400B are exposed. These trenches are reserved for the formation of vias, and therefore they may also be referred to as via trenches or via holes. Note that although the via trenches may be etched in both the region 270A and 270B, the via trenches in the region 270A are not specifically illustrated in FIG. 6 for reasons of simplicity. For example, the via trenches etched in the region 270A may be located in a portion of the IC device 200 that is not located at the cross-section of FIG. 6, which is why these via trenches in the region 270A are not directly visible in FIG. 6. In comparison, the via trench formed in the region 270B is illustrated as a trench 440B. The trench 440B exposes a portion of the upper surface of the metal line 400B. Regardless of where the via trenches such as the trench 440B are formed, it is understood that the eventual conductive vias formed to fill these via trenches will be used to interconnect the M1 layer with a M2 metal layer to be formed above as a part of the dual damascene process.

Figure 7:
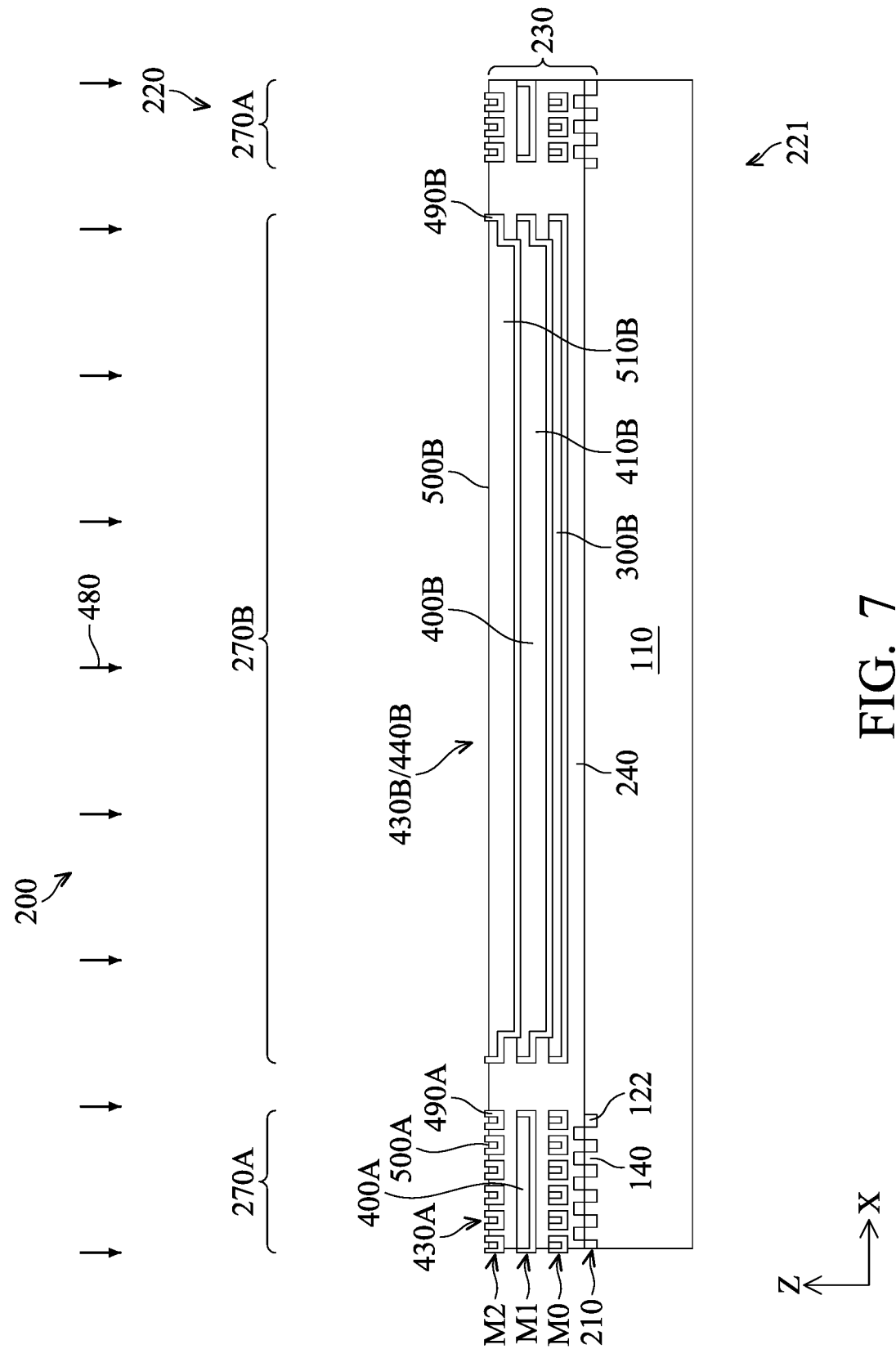

Referring now to FIG. 7, a plurality of deposition processes 480 may be performed to the IC device 200 to fill the trench 430B/440B in the region 270B (as well as the unillustrated trenches in the region 270A) with conductive materials as a part of the dual damascene process. As was the case for the deposition processes 280 and 380, the deposition processes 480 may perform a first step to form barrier layers 490A and 490B in the trenches 430A and 430B/440B, respectively, and then perform a second step to form metal lines 500A and 500B over the barrier layers 390A and 390B, respectively. Note that the second step of the deposition processes 480 forms not just the metal lines 500A and 500B, but also the conductive vias therebelow, such as a via 510B below the metal line 500B. In other words, the via 510B and the metal line 500B are formed using the same deposition process and have the same material compositions (e.g., copper, cobalt, ruthenium, tungsten, aluminum, etc.). Also note that since the locations of the via trenches in the region 270A are not directly visible in FIG. 7, the resulting conductive vias formed in the region 270A are not directly visible in FIG. 7 either, though it is understood that the conductive vias in the region 270A are also formed at the same time as the conductive via 510B through the same fabrication processes.

Based on the above discussions, it can be seen that a Metal-2 layer (labeled as M2 in FIG. 7) is formed over the Metal-1 layer through the dual damascene process. The resulting Metal-2 layer includes the barrier layers 490A-490B and the metal lines 500A-500B collectively, and it is interconnected to the Metal-1 layer by the unillustrated conductive vias in the region 270A and the conductive via 510B in the region 270B. It is understood that, although the conductive vias, such as the conductive via 510B, have been considered to be components external to the Metal-2 layer, they may also be considered as components belonging to the Metal-2 layer in some cases. In other words, the Metal-2 layer (and the additional metal layers to be formed thereabove) may be considered to include the metal lines but not the vias in some cases, or they may be considered to include both the metal lines as well as the vias in other cases.

Figure 8:
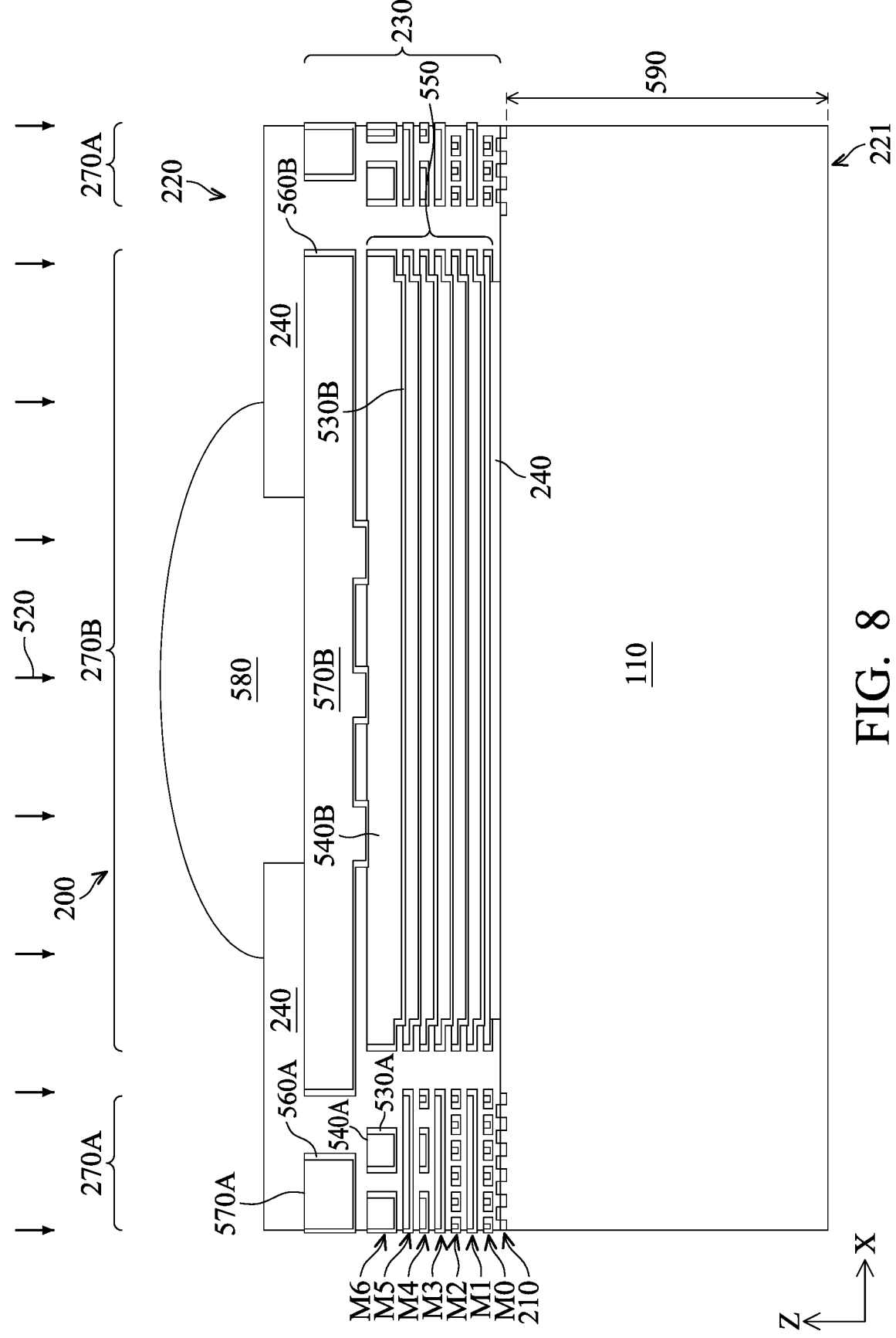

Referring now to FIG. 8, additional fabrication processes 520 may be performed to the IC device 200 to continue its fabrication. For example, a plurality of additional metal layers, such as metal layers M3, M4, M5, and M6, may be formed as a part of the multi-layer interconnect structure 230 using the dual damascene process discussed above with reference to FIGS. 4-7. Similar to the metal layers M1 and M2, the metal layers M3, M4, M5, and M6 may each include a respective barrier layer, a respective conductive via formed over the barrier layer, and a respective metal line formed over the conductive via. For example, as a topmost metal layer of the multi-layer interconnect structure 230, the metal layer M6 includes metal lines 540A (which are surrounded by barrier layers 530A) in the region 270A, as well as metal lines 540B (which are surrounded by barrier layers 530B) in the region 270B.

At this stage of fabrication, the components of the multi-layer interconnect structure 230 located in the region 270B (e.g., the M0-M6 metal layers in the region 270B) collectively form a first portion 550 of the TSV of the present disclosure. It is understood that the presence of the plurality of barrier layers (e.g., the barrier layer 530B in FIG. 8, or the barrier layers 390B and 490B discussed above with reference to FIGS. 5 and 7) interposed between the metal layers M0-M6 is one of the unique physical characteristics of the IC device 200 of the present disclosure, since their presence is an inherent result of the layer-by-layer process flow used to form the first portion 550 of the TSV herein. Conventional TSVs would lack the plurality of barrier layers interposed between the metal layers, because conventional TSV formation schemes typically form the TSV as a big conductive block all at once, rather than using a layer-by-layer approach.

Another unique physical characteristic of the first portion 550 of the TSV herein is that it has a plurality of T-shaped metal layers stacked together. The T-shape of each of the metal layers M1-M6 is a result of the dual damascene process used to form each metal layer. In other words, the bottom portion (which is narrower) of each T-shaped metal layer corresponds to the conductive via, and the top portion (which is wider) of each T-shaped metal layer corresponds to the metal line. Another way of describing this trait is that each metal line of the first portion 550 of the TSV is vertically separated from an adjacent metal line (above or below, depending on the metal line) by a portion of the insulating layer 240. The plurality of T-shaped metal layers stacked together also translates into a plurality of downwardly-facing (e.g., facing the back side 221) surfaces of the first portion 550 of the TSV, where each downwardly-facing surface is a portion of the metal line (in each metal layer) that extends laterally beyond the respective via therebelow. Again, such a trait is missing in the conventional TSV, because the conventional TSV is formed as a single conductive block, and not by the layer-by-layer process flow of the present disclosure discussed above.

One of the benefits of the present disclosure is that stress reduction may be achieved by the fact that this first portion 550 of the TSV is formed in a layer-by-layer manner, along with the rest of the metal layers of the multi-layer interconnect structure 230. This is because the formation of each metal layer M0-M6 involves just a small structure (e.g., the metal layer itself), rather than a big block of conductive material according to conventional TSV schemes. The thermal expansion and/or contraction associated with the plurality of metal layers M0-M6 may also be more flexible and may be better tolerated by the rest of the IC device 200, compared to a big unitary block structure of a conventional TSV.

The layer-by-layer formation scheme of this first portion 550 of the TSV also reduces a loading effect. In more detail, the formation of conventional TSVs may etch a relatively big TSV trench (extending from the back side 221 toward the front side 220) in the region 270B after the metal layers of the multi-layer interconnect structure 230 have already been formed in the region 270A. This big TSV trench may then be filled by a conductive material to form a TSV as a single block structure. However, such a process flow involves etching a trench in a relatively empty or sparsely populated region 270B (also referred to as an "iso" region). Meanwhile, the presence of the existing components of the multi-layer interconnect structure 230 in the region 270A makes the region 270A a heavily populated region with a high density (also referred to as a "dense" region). The juxtaposition of the "iso" region 270B and the "dense" region 270A exacerbates a loading effect, which may cause the resulting TSV formed to suffer from a dishing effect (e.g., curved surfaces and/or larger resistances). In contrast, the present disclosure forms the components of the first portion 550 of the TSV in the region 270B using a layer-by-layer approach along with the rest of the multi-layer interconnect structure 230 in the region 270A. As such, the loading effect concerns are substantially reduced, and any dishing effect may be negligible for the resulting first portion 550 of the TSV, if at all. Accordingly, the performance of the TSV herein may be improved.

Still referring to FIG. 8, the additional fabrication processes 520 may also include processes used to form conductive pads over the multi-layer interconnect structure 230. For example, a conductive pad 570A may be formed over the multi-layer interconnect structure 230 in the region 270A, and a conductive pad 570B may be formed over the multi-layer interconnect structure 230 (and more specifically, over the metal line 540B of the topmost metal layer M6) in the region 270B. In some embodiments, the conductive pads 570A and 570B may include aluminum. Other conductive materials may be used to implement the conductive pads 570A and 570B in other embodiments. The conductive pads 570A and 570B may also be surrounded by barrier layers 560A and 560B, respectively. The barrier layers 560A and 560B may include titanium or titanium nitride in various embodiments. The additional fabrication processes 520 mays also include processes used to form a conductive bump 580 over a portion of the conductive pad 570B. In some embodiments, the conductive bump 580 may include a solder ball. The conductive bump 580 may be used to establish electrical connections between the IC device 200 (e.g., through the TSV) and external devices.

Figure 9:
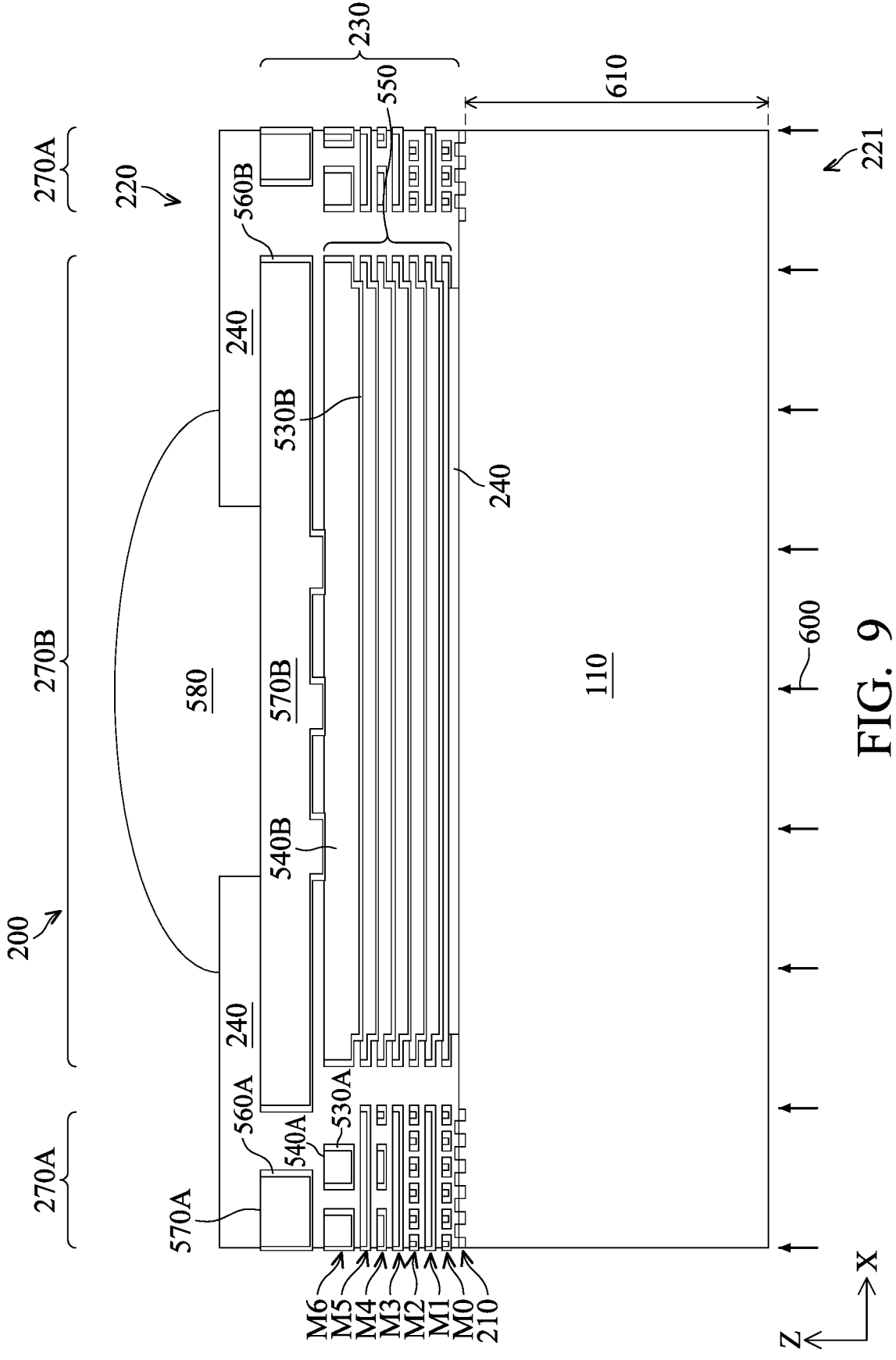

At the stage of fabrication of FIG. 8, the substrate 110 has an initial thickness 590 measured in the Z-direction. In some embodiments, the initial thickness 590 is in a range between about 700 microns and about 900 microns. Referring now to FIG. 9, a substrate thinning process 600 is performed from the back side 221 of the IC device 200 to reduce the initial thickness 590 down to a reduced thickness 610. In some embodiments, the substrate thinning process 600 may include one or more mechanical grinding and/or chemical etching processes to grind and/or etch away portions of the substrate 110 from the back side 221. The substrate thinning process 600 may also include one or more planarization processes, such as CMP processes. In some embodiments, the reduced thickness 610 is less than about 100 microns. For example, the reduced thickness 610 may be in a range of several microns (e.g., between about 2 microns and about 10 microns). Note that the reduction in the thickness of the substrate 110 may not be immediately apparent in the illustrated drawings, since FIGS. 8-9 are not drawn in scale.

Figure 10:
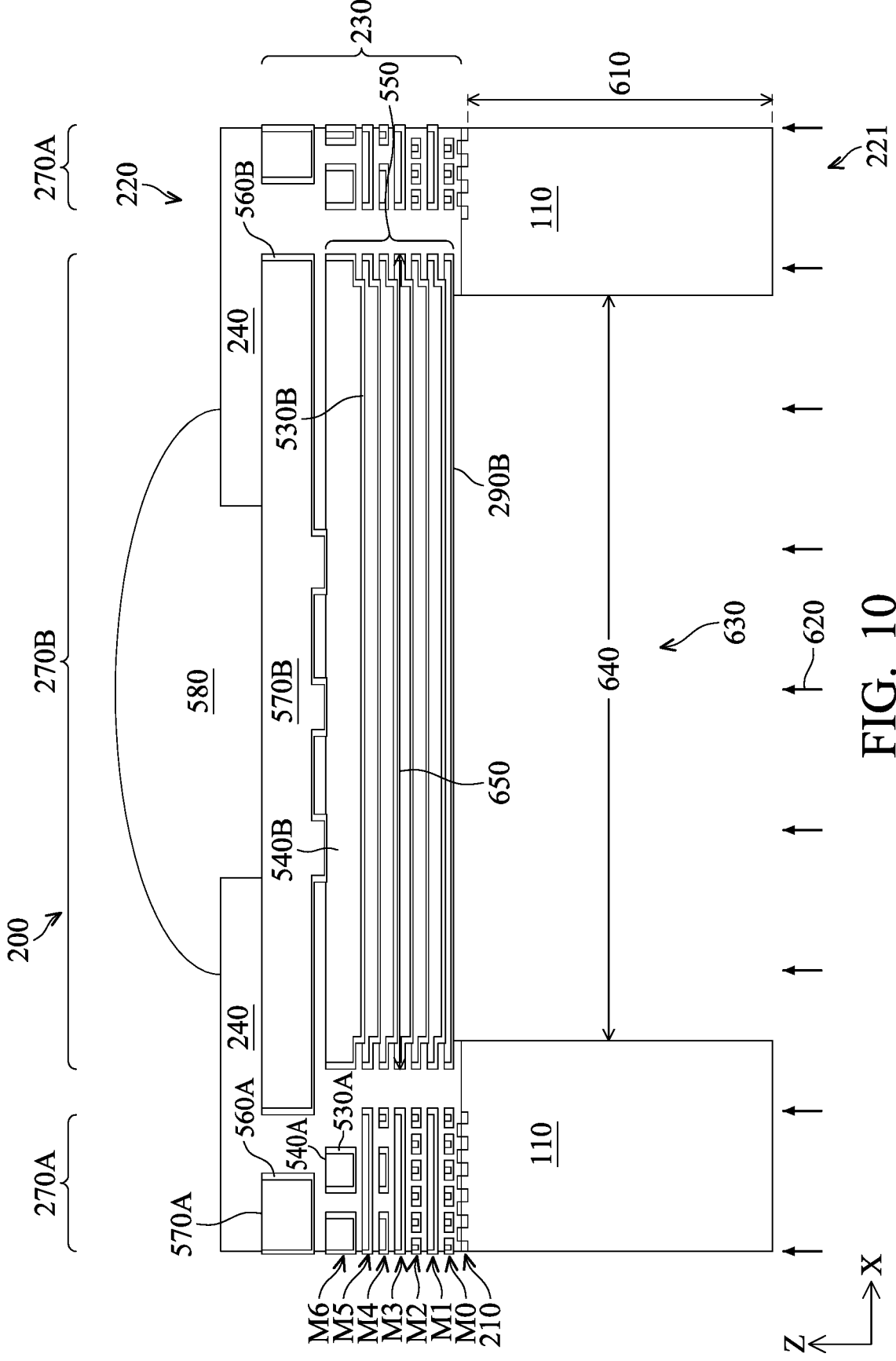

Referring now to FIG. 10, an etching process 620 may be performed to the IC device 200 from the back side 221. In some embodiments, the etching process 620 includes a dry etching process. In other embodiments, the etching process 620 includes a wet etching process. The etching process 620 forms an opening 630 (or trench) through the substrate 110 and a portion of the insulating layer 240, where the opening 630 extends from the back side 221 toward the front side 220. The opening 630 exposes a portion of the M0 layer, for example, the bottom surface (or back side surface) of the barrier layer 290B of the M0 layer. The opening 630 also has a lateral dimension 640 measured in the Z-direction. In the illustrated embodiment, the lateral dimension 640 is smaller than an average lateral dimension 650 of the metal layers M0-M6 of the multi-layer interconnect structure 230 in the region 270B.

Figure 11:
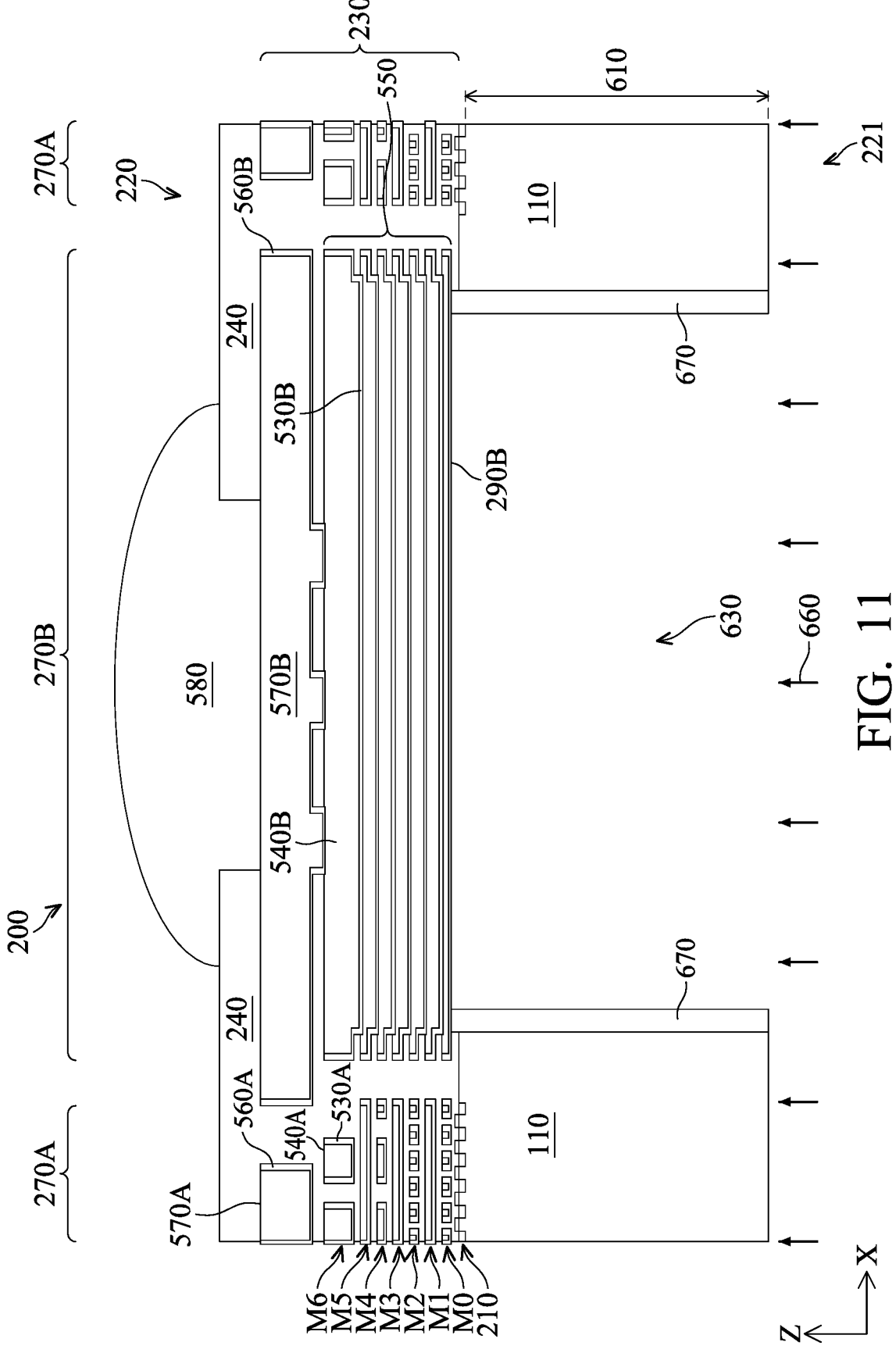

Referring now to FIG. 11, a deposition process 660 is performed to the IC device 200 from the back side 221. The deposition process 660 may include a CVD process, a PVD process, an ALD process, or combinations thereof. The deposition process 660 deposits a liner layer 670 on the sidewalls of the opening 630. In other words, the liner layer 670 is formed on the side surfaces of the substrate 110 exposed by the opening 630. In some embodiments, a portion of the liner layer 670 may also be formed on the back side surface of the barrier layer 290B, but an etching process may be subsequently performed to etch away this portion of the liner layer 670, which leaves just the portions of the liner layer 670 on the sidewalls of the opening 630. The liner layer 670 includes a dielectric material, for example, silicon oxide. It is understood that a second portion of the TSV will be formed to fill the opening 630. The liner layer 670 is configured to stop or at least reduce potential leakage between the substrate 110 and the second portion of the TSV.

Figure 12:
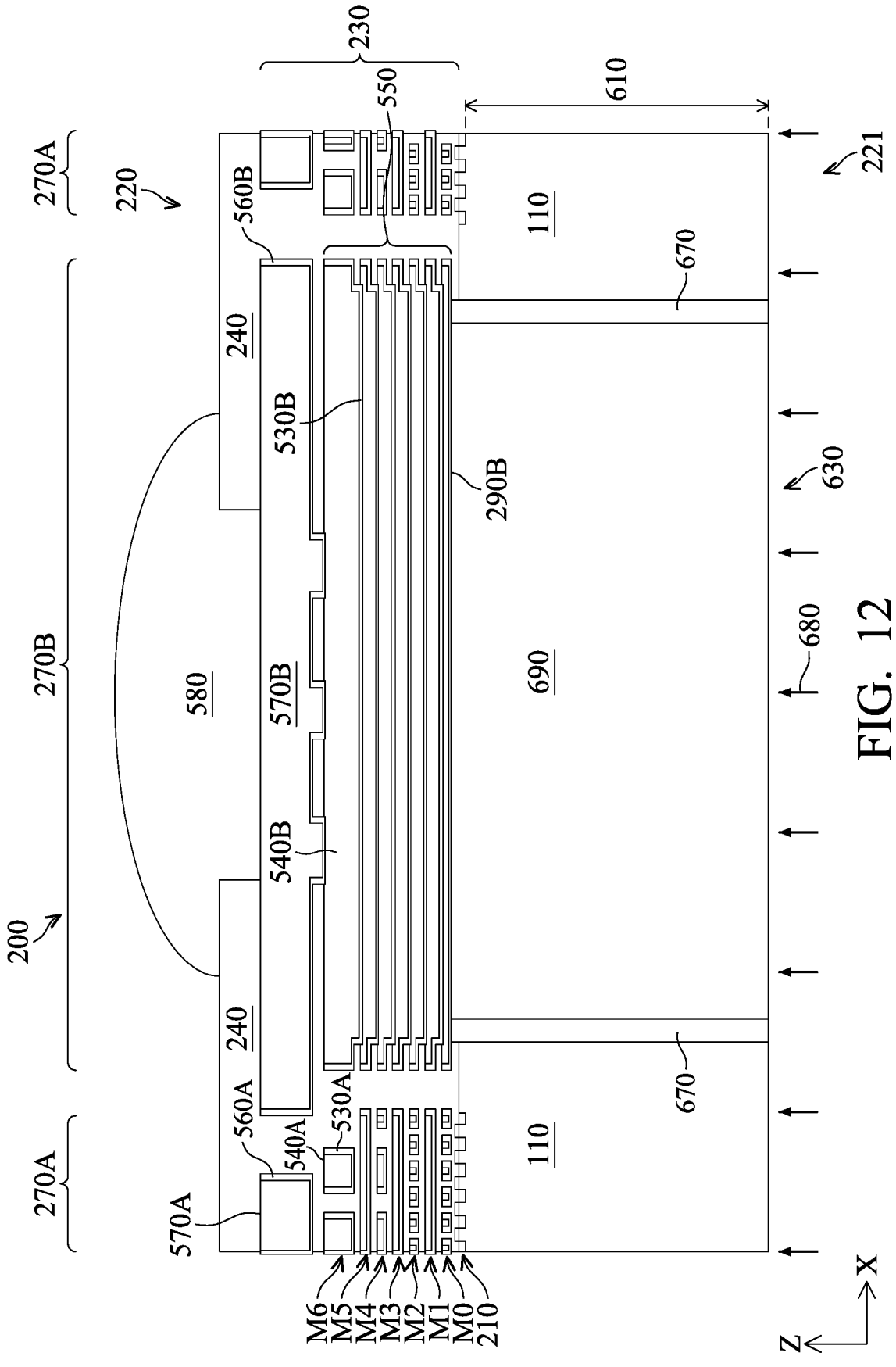

Referring now to FIG. 12, a deposition process 680 is performed to the IC device 200 from the back side 221. The deposition process 680 may include a CVD process, a PVD process, an ALD process, or combinations thereof. The deposition process 680 deposits a conductive material (e.g., copper, cobalt, ruthenium, aluminum, etc.) to completely fill the opening 630. A planarization process (e.g., a CMP process) may then be performed to polish the back side surface of the conductive material, such that it is substantially co-planar with the back side surfaces of the liner layers 670 and the substrate 110.

At this stage of fabrication, a second portion 690 of the TSV is formed. This second portion 690 of the TSV is electrically and physically connected to the first portion 550 of the TSV. For example, the front side surface of the second portion 690 of the TSV is in direct physical contact with the M0 layer in the region 270B, specifically, with the back side surface of the barrier layer 290B. Since the second portion 690 of the TSV is formed after all the fabrication processes performed to form the metallization components on the front side 220 of the IC device 200, it avoids the stress related to thermal expansion and/or contraction. For example, thermal processes may be a part of the fabrication processes used to form the metal layers M0-M6, the conductive pads 570A-570B, or the conductive bump 580. Had the second portion 690 of the TSV already been in place when these thermal processes are performed, the second portion 690 of the TSV would have expanded and/or contracted, which could cause stress that may negatively affect its nearby components. Here, since the second portion 690 of the TSV had not been formed (e.g., the opening 630 had not been etched into the substrate 110, nor was it filled by a conductive material) when these thermal processes were performed, there would be no thermal expansion/contraction associated with such a non-existent block of metal, and therefore the stress caused by thermal expansion/contraction is avoided, which improves device performance.

Figure 13:
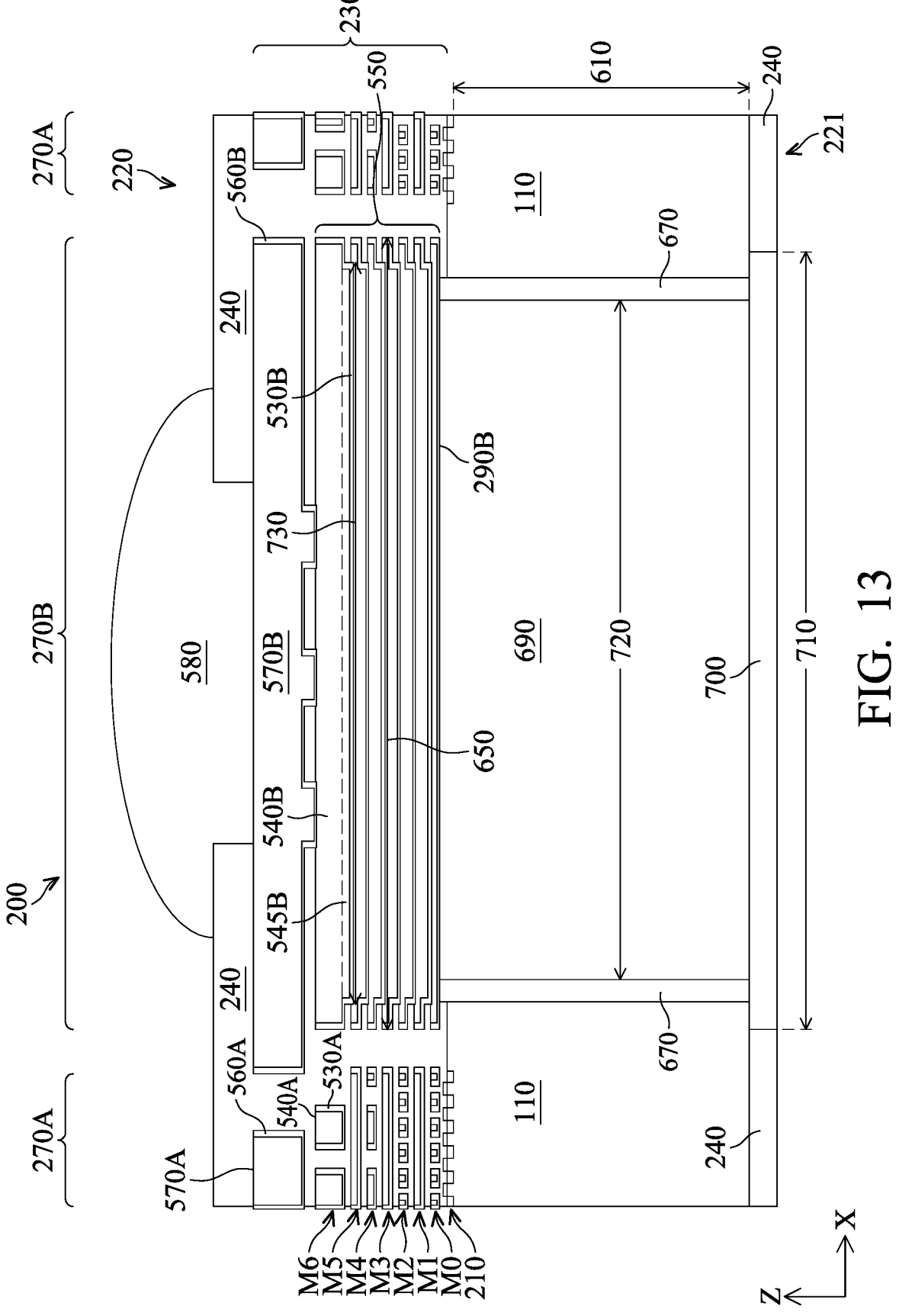

Referring now to FIG. 13, additional fabrication processes may be performed to form a conductive pad 700 on the back side 221 of the IC device 200. For example, another portion of the insulating layer 240 may be deposited over the back side surfaces of the substrate 110, the liner layers 670, and the second portion 690 of the TSV. An etching process may then be performed to etch an opening in the insulating layer 240 from the back side 221. This opening may then be filled by a conductive material (e.g., copper, cobalt, ruthenium, aluminum, etc.). A planarization process such as CMP may then be performed to planarize the back side surface of the conductive material, and the conductive pad 700 is formed the remaining portion of the conductive material in the opening. The conductive pad 700 has a lateral dimension 710 measured in the X-direction. The lateral dimension 710 is greater than the lateral dimension 720 of the second portion 690 of the TSV. The conductive pad 700 helps to provide electrical connectivity to the IC device 200, for example, through the TSV that is made up of the first portion 550 and the second portion 690.

Figures 14A, 14B, 14C:
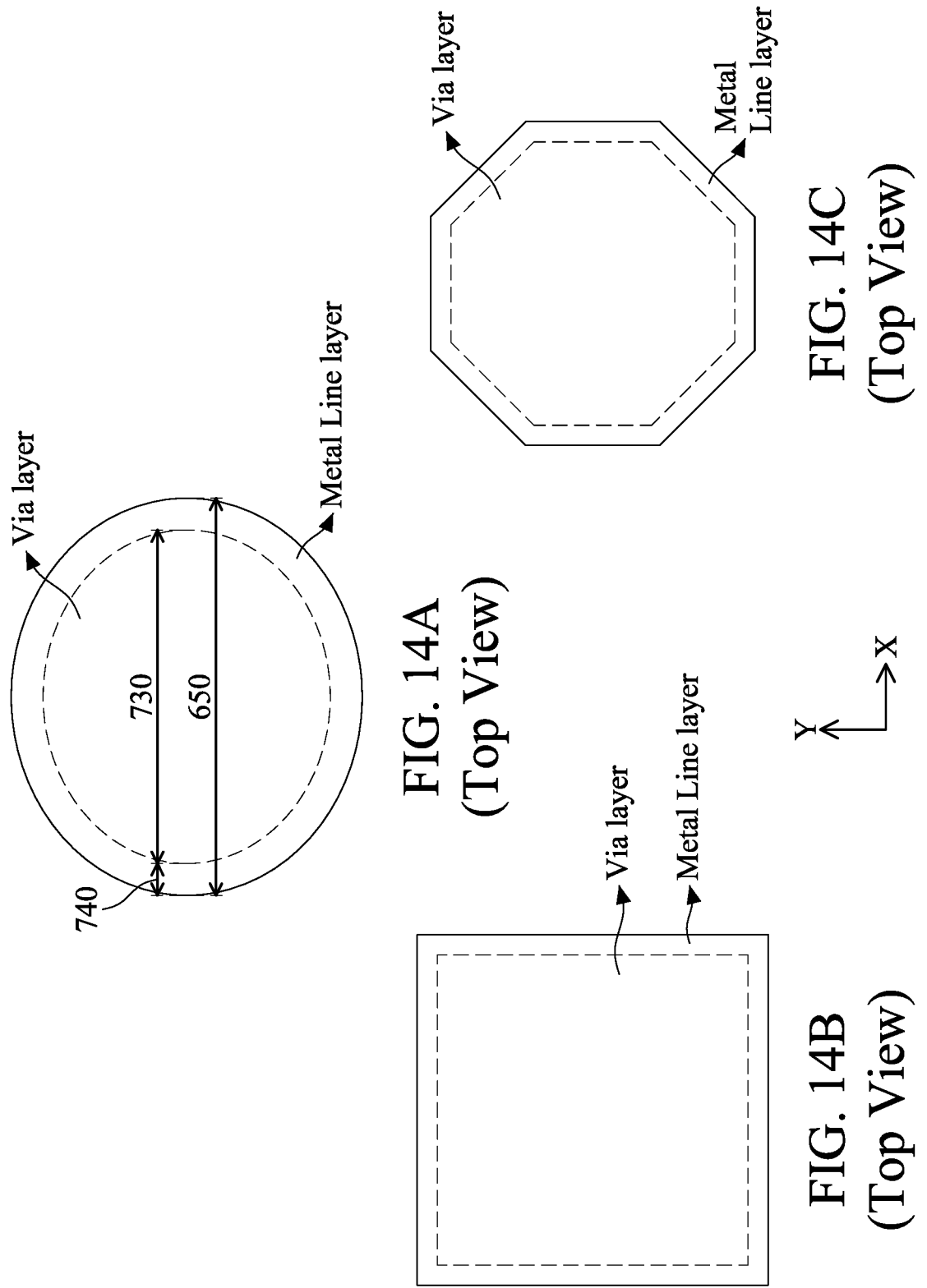
FIGS. 14A, 14B, and 14C illustrate top views of a portion of a TSV of an IC device according to embodiments of the present disclosure.

Referring now to FIGS. 14A, 14B, and 14C, the top views of the first portion 550 of the TSV are illustrated according to various embodiments of the present disclosure. In more detail, the top views in FIGS. 14A-14C correspond to a horizontal plane defined by the X-direction and the Y-direction that is perpendicular to the X-direction. In the embodiment of FIG. 14A, the first portion 550 of the TSV has a substantially circular shape. In the embodiment of FIG. 14B, the first portion 550 of the TSV has a substantially rectangular shape (e.g., a square shape). In the embodiment of FIG. 14C, the first portion 550 of the TSV has a substantially octagonal shape. Other shapes may also be suitable, such as elliptical shapes, trapezoidal shapes, triangular shapes, or an arbitrary shape. For reasons of simplicity, however, these additional shapes are not illustrated herein.

Regardless of the top view shape/profile of the first portion 550 of the TSV, it can be seen that the first portion 550 of the TSV is made up of metal line layers and via layers. As discussed above with reference to FIGS. 3-8, the metal line layers correspond to the metal lines of the M0-M6 metal layers of the multi-layer interconnect structure 230 in the region 270B of the IC device 200, whereas the via layers correspond to the vias of the multi-layer interconnect structure 230 that electrically interconnect the metal line layers of the M0-M6 metal layers. For example, if the top view is taken at a point above (on the front side 220) the topmost metal layer M6, the metal line layer would correspond to the metal line 540B (see FIG. 13), and the via layer would correspond to a via 545B (also see FIG. 13) disposed immediately below the metal line 540B. As discussed above, the metal line 540B and the via 545B are formed together using a dual damascene process. As such, there may not be a physical demarcation line between the metal line 540B and the via 545B. However, for the sake of providing an illustration, a horizontal dashed line is illustrated in FIG. 13 to visually denote the horizontal boundary (which may not be visible) between the metal line 540B and the via 545B. The vertical boundaries (also not directly visible in the top view) between the metal line 540B and the via 545B are illustrated as a dashed circle in FIG. 14A, a dash rectangle in FIG. 14B, and a dashed octagon in FIG. 14C.

One detectable physical difference between the metal line 540B and the via 545B is their different lateral dimensions. For example, as shown in both FIG. 13 and FIG. 14A, the metal line layer may have the lateral dimension 650, whereas the via layer may have a lateral dimension 730 that is smaller than the lateral dimension 650. Note that the lateral dimension 650 may also represent an average lateral dimension of the metal lines of any given metal layer M0-M6, while the lateral dimension 730 may also represent an average lateral dimension of the vias.

As discussed above, the differences in size between the lateral dimension 650 and the lateral dimension 730 is a result of the dual damascene process. For example, as shown in FIG. 4, the top trench 330B is wider than the bottom trench 340B when these trenches were etched into place. Since the top trench 330B is eventually filled by the metal line layer, and since the bottom trench 340B is eventually filled by the via layer, it follows that the metal line layer is wider than the via layer, which corresponds to the differences in the lateral dimensions 650 and 730. In some embodiments, a difference 740 between the lateral dimension 650 and the lateral dimension 730 is in a range between about 0 nanometers and about 500 nanometers. The size difference between the lateral dimensions 650 and 730 may also be expressed as a ratio. In some embodiments, a ratio between the lateral dimension 650 and the lateral dimension 730 is in a range between about 1:1 and about 1.5:1. It is understood that the above range is not randomly chosen but specifically configured to optimize the performance of the IC device 200. For example, if the ratio is too high, that means the via may be too small in comparison to the metal line, which may unduly increase the parasitic resistance of the via. On the other hand, if the ratio is too small, that means the via may be too big in comparison to the metal line, which may make the difficulty of the fabrication process (e.g., the dual damascene process). The above ratio range ensures that the metal lines and vias are still easy to fabricate without incurring penalties such as parasitic resistance.

It is understood that although FIGS. 14A-14C illustrate various top view shapes/profiles of the first portion 550 of the TSV, these top view shapes/profiles may apply to the second portion 690 of the TSV as well. In other words, the second portion 690 of the TSV, as a single conductive block structure, may also have a circular top view shape, a rectangular top view shape, an octagonal top view shape, or another suitable top view shape.

Figure 15:
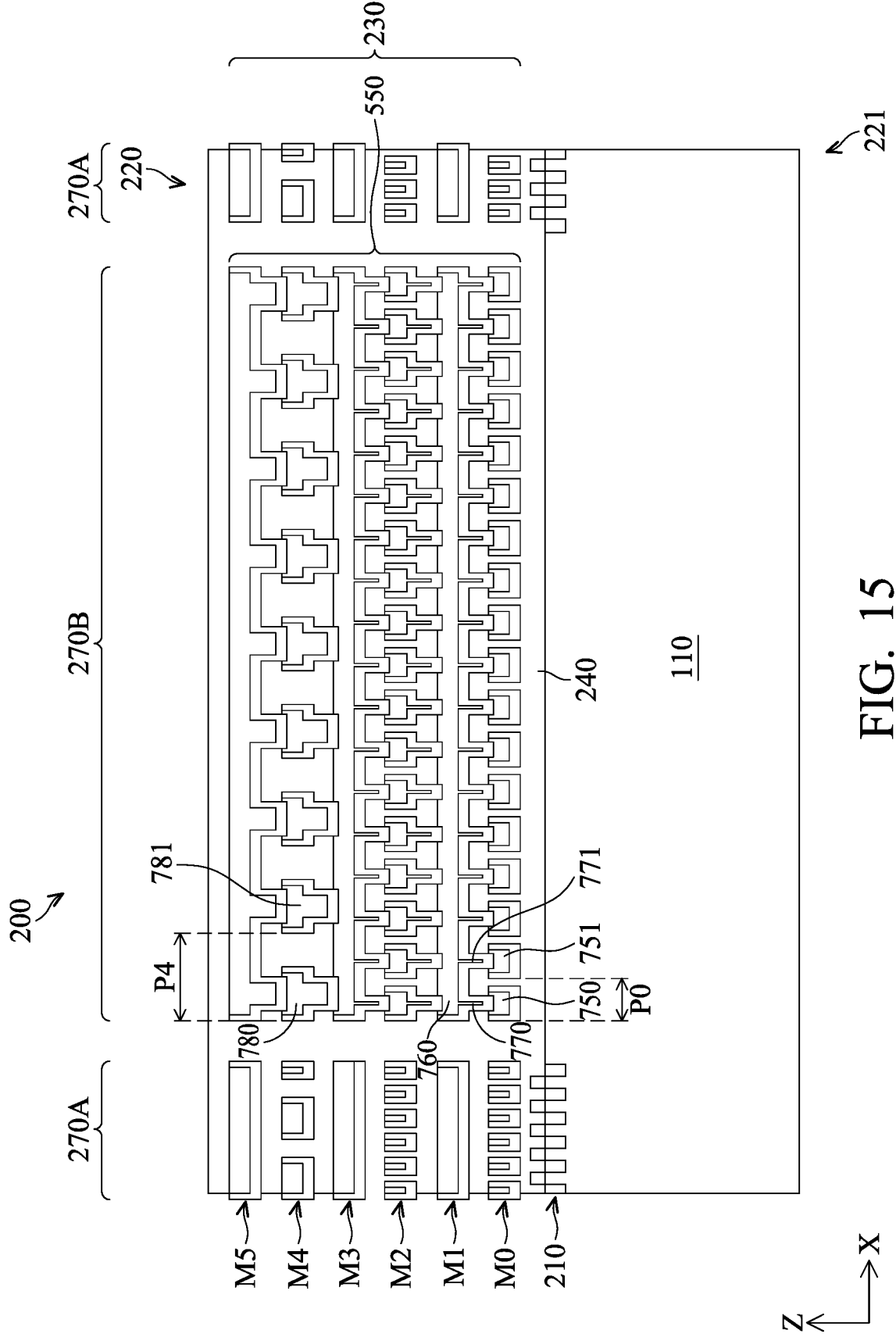
FIG. 15 illustrates a cross-sectional views of an IC device at a stage of fabrication according to embodiments of the present disclosure.

FIG. 15 illustrates a diagrammatic fragmentary cross-sectional side view of a portion of the IC device 200 according to an alternative embodiment of the present disclosure. For reasons of consistency and clarity, similar components in FIGS. 13 and 15 will be labeled the same. For example, at the stage of fabrication illustrated in FIG. 15, the first portion 550 of the TSV has been formed, but the second portion 690 (see FIG. 13) of the TSV has not been formed yet. Similar to the embodiment of FIG. 13, the first portion 550 of the TSV in the embodiment of FIG. 15 is also formed as a part of the multi-layer interconnect structure 230 in the region 270B over the front side 220 of the substrate 110. Unlike the embodiment of FIG. 13, however, the first portion 550 of the TSV in the embodiment 15 does not have a solid structure, but has a mesh structure instead.

In more detail, rather than implementing each of the via layers and the metal line layers as a single block structure in each of the metal layers M0-M5 (the metal layer M6 of FIG. 13 is not illustrated in FIG. 15 for reasons of simplicity), the via layers and the metal line layers in FIG. 15 are implemented as a plurality of discrete components that are separated from one another in each of the metal layers M0-M5 in a mesh format. Nevertheless, it is understood that the via layers and the metal line layer—as components of the first portion 550 of the TSV—are still electrically and physically interconnected together to form a continuous structure, so that the TSV can still serve its purpose of being an electrically conducting/interconnecting structure.

In more detail, a plurality of metal lines (e.g., metal lines 750 and 751) are formed in the metal layer M0, where the metal lines in the metal layer M0 each extend in the Y-direction (i.e., orthogonal to the X-Z plane illustrated in FIG. 15) and are spaced apart from adjacent metal lines in the metal layer M0 in the X-direction. Meanwhile, a plurality of metal lines (e.g., metal line 760) are also formed in the metal layer M1, where the metal lines in the metal layer M1 each extend in the X-direction. However, since the cross-sectional view of FIG. 15 is taken at a single plane, the resulting cross-sectional view of FIG. 15 captures just one of the metal lines 760 of the metal layer M1. Nevertheless, it is understood that each of the metal lines (e.g., metal line 760) in the metal layer M1 are also spaced apart from adjacent metal lines in the metal layer M1 in the Y-direction. Similarly, a plurality of vias (e.g., vias 770 and 771) are formed to electrically interconnect the metal lines (e.g., metal lines 750-751) of the metal layer M0 with the metal lines (e.g., metal line 760) of the metal layer M1. The vias 770-771 are also spaced apart from one another in the X-direction.

It can be seen that although the individual metal lines and/or vias of the first portion 550 of the TSV may be spaced apart from other individual metal lines and/or vias of the first portion 550 of the TSV, they are still all interconnected together as an electrically and physically continuous structure (albeit in mesh form). In contrast, at least subsets of the metal lines and vias located above the transistors 210 are discontinuous from other subsets, since these metal lines and vias over the transistors 210 are meant to provide electrical connectivity to targeted transistors, and the electrical and physical discontinuity for these subsets of metal lines and vias from other subsets of metal lines and vias help prevent the undesirable electrical shorting between transistors that should not be shorted together.

In some embodiments, the metal lines and/or vias in different metal layers may have different pitches. For example, the metal lines in the metal layer M0 have a pitch P0, whereas the metal lines in the metal layer M4 have a pitch P4 that is greater than the pitch P0. In that regard, a pitch defined by the metal lines in a given metal layer is equal to: the average width (or lateral dimension) of the metal lines plus the spacing or distance separating adjacent metal lines. For example, the pitch P0=the lateral dimension of the metal lines 750 or 751+the distance between the metal lines 750 and 751, and the pitch P4=the lateral dimension of the metal lines 780 or 781+the distance between the metal lines 780 and 781. The similar is true for the vias that interconnect the metal lines between different metal layers. In other words, the vias located closer to the substrate 110 may define a smaller via pitch, and the vias located farther away from the substrate 110 may define a greater via pitch.

Figures 16A, 16B:
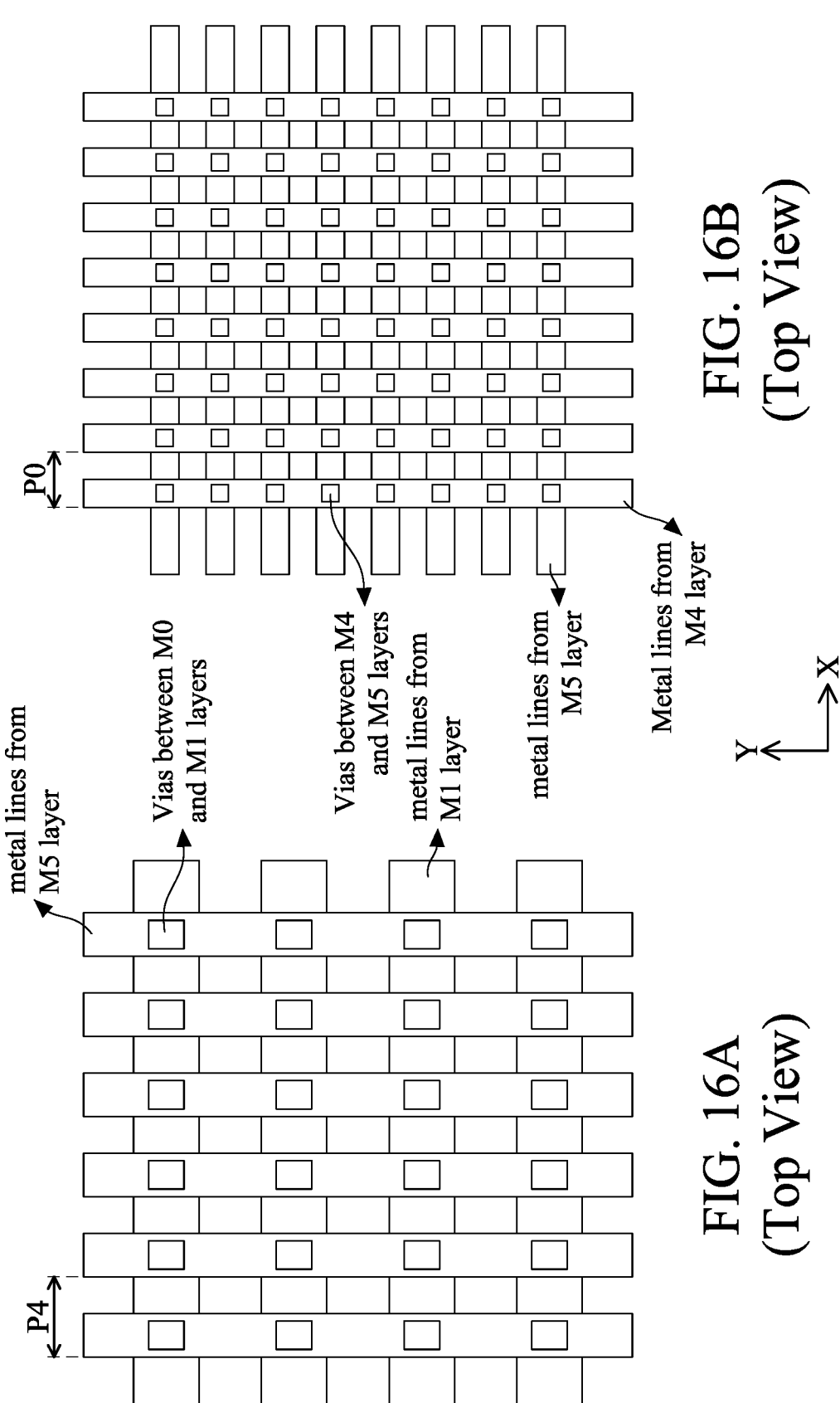
FIGS. 16A, 16B, 17A, and 17B illustrate top views of a portion of a TSV of an IC device according to embodiments of the present disclosure.

The structural arrangement of the mesh structure of the first portion 550 of the TSV is also illustrated in the top views of FIGS. 16A and 16B. For reason of simplicity, the top views of FIG. 16A-16B each correspond to just two of the respective metal layers. For example, FIG. 16A illustrates the metal layers M5 and M4, and FIG. 16B illustrates the metal layers M1 and M0. FIG. 16A also illustrates the vias that are disposed between the metal lines from the metal layers M5 and M4, and FIG. 16B also illustrates the vias that are disposed between the metal lines from the metal layers M1 and M0. Note that the metal lines in FIGS. 16A and 16B extend in both the X-direction and the Y-direction, because the metal lines from the metal layers M5 (of FIG. 16A) and M1 (of FIG. 16B) each extend in the X-direction, while the metal lines from the metal layers M4 (of FIG. 16A) and M0

(of FIG. 16B) each extend in the Y-direction. The pitches P4 and P0 are also illustrated in FIGS. 16A and 16B, respectively. Again, since the metal layers M5 and M4 are more vertically elevated (e.g., farther away from the substrate 110) than the metal layers M1 and M0, the pitches (e.g., P4) shown in FIG. 16A are greater than the pitches (e.g., P0) shown in FIG. 16B.

It is understood that the mesh structure illustrated in FIGS. 15 and 16A-16B is merely a non-limiting embodiment of the mesh structure. FIGS. 17A and 17B illustrate the top views of two other alternative embodiments of the mesh structure. In FIG. 17A, the mesh structure may be referred to as a donut-shaped mesh structure that includes a plurality of concentric circles. Each of the circles includes a respective metal line from one of the metal layers (e.g., M0-M6), as well as the via interconnecting the metal line and a metal line (not illustrated) from an adjacent metal layer disposed immediately thereabove or therebelow. In other words, the metal lines in the metal layers M0-M6 are each implemented to have a circular top view profile, and the vias interconnecting the metal layers M0-M6 are also each implemented to have a circular top view profile.

Similarly, in FIG. 17B, the mesh structure includes a plurality of concentric rectangles. Each of the rectangles includes a respective metal line from one of the metal layers (e.g., M0-M6), as well as the via interconnecting the metal line and a metal line (not illustrated) from an adjacent metal layer disposed immediately thereabove or therebelow. In other words, the metal lines in the metal layers M0-M6 are each implemented to have a rectangular top view profile, and the vias interconnecting the metal layers M0-M6 are also each implemented to have a rectangular top view profile.

The IC device 200 may be implemented in a variety of IC applications, including memory devices such as Static Random-Access Memory (SRAM) devices. In that regard, FIG. 18 illustrates an example circuit schematic for a single-port SRAM cell (e.g., 1-bit SRAM cell) 800 in which the IC device 200 may be implemented. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 19 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the various deposition processes discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 20 is a flowchart illustrating a method 1000 of fabricating a semiconductor device. The method 1000 includes a step 1010 to form a plurality of transistors over a first side of a substrate.

The method 1000 includes a step 1020 to form, over the first side of a substrate, a multi-layer interconnect structure that includes a plurality of metal layers interconnected together by a plurality of vias. A first region of the multi-layer interconnect structure is formed over the transistors. A second region of the multi-layer interconnect structure is laterally separated from the first region by a non-conductive material.

The method 1000 includes a step 1030 to reduce, after the multi-layer interconnect structure has been formed, a thickness of the substrate.

The method 1000 includes a step 1040 to etch, after the thickness of the substrate has been reduced, an opening from a second side of the substrate toward the first side. The opening is etched until a portion of the multi-layer interconnect structure in the second region is exposed.

The method 1000 includes a step 1050 to fill the opening with a conductive material. A through-substrate via (TSV) is formed collectively by the conductive material and the second region of the multi-layer interconnect structure.

In some embodiments, the opening is etched such that a lateral dimension of the opening is less than a lateral dimension of the metal layers in the second region of the interconnect structure.

In some embodiments, the forming the multi-layer interconnect structure comprises forming a mesh structure in the second region of the interconnect structure. In some embodiments, the mesh structure is formed such that different metal layers of the mesh structure have different pitches.

In some embodiments, at least some of the metal layers in the second region of the multi-layer interconnect structure are formed using a dual-damascene process.

It is understood that additional steps may be performed before, during, or after the steps 1010-1050. For example, in some embodiments, the method 1000 may further include the steps of forming a first conductive pad over the second region of the multi-layer interconnect structure and thereafter forming a conductive bump over the first conductive pad. These steps are after the multi-layer interconnect structure has been formed but before the thickness of the substrate has been reduced. The method 1000 may further include a step of: after the filling of the opening, forming a second conductive pad over the conductive material from the second side. For reasons of simplicity, these additional processes are not discussed herein in detail.

Based on the above discussions, it can be seen that the present disclosure implements a unique TSV fabrication scheme. First, a first portion of the TSV is formed using a layer-by-layer stacking process, in which a plurality of metal layers and vias are formed (e.g., using dual damascene processes) over a front side of a substrate, concurrently with the metal layers and vias formed over electrical circuitry (e.g., circuitry containing transistors). In other words, two different regions of a multi-layer interconnect structure are formed concurrently over the front side of a substrate, where one of the regions constitutes the first portion of the TSV, while the other one of the regions provides electrical connections for the electrical circuitry. After the metallization processes are performed to form additional components over the front side of the substrate, a second portion of the TSV is formed by etching a trench through the substrate from the back side and filling the trench with a conductive material. The second portion of the TSV is aligned with, and electrically coupled to, the first portion of the TSV.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the reduction in stress. For example, by forming the first portion of the TSV using the layer-by-layer approach, a smaller amount of stress is incurred during the formation of each metal layer. In addition, since the second portion of the TSV is formed after the thermal processes associated with the formation of the front-side metallization have been performed, the second portion of the TSV avoids the thermal expansion or contraction that would have been caused by these thermal processes. Another advantage is the reduction of a loading effect. For example, conventional methods of forming a TSV involves etching a trench in a relatively empty region (e.g., an "iso" region) that is located next to regions with other metallization features (e.g., a "dense" region). The disparity between the pattern density in the "iso" and "dense" regions may lead to a dishing effect, which could warp the resulting TSV and/or increase its parasitic resistance. In contrast, the first portion of the TSV herein is formed layer-by-layer concurrently with the rest of the "regular" multi-layer interconnect structure. As such, the formation of the first portion of the TSV is not done in an "iso" region that is located adjacent to the "dense" region, which substantially reduces the loading effect. Consequently, the TSV formed herein has a better device structure and a smaller parasitic resistance. Other advantages may include ease of fabrication and compatibility with existing fabrication processes.

The advanced lithography process, method, and materials described above can be used in many applications, including in IC devices using fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to an IC device. The IC device includes a substrate. The IC device includes a multi-layer interconnect structure disposed over a first side of the substrate. The multi-layer interconnect structure includes a plurality of metal layers. The IC device includes a first portion of a through-substrate via (TSV) disposed over the first side of the substrate. The first portion of the TSV includes a plurality of conductive components belonging to the plurality of metal layers of the multi-layer interconnect structure. The IC device includes a second portion of the TSV that extends vertically through the substrate from the first side to a second side opposite the first side. The second portion of the TSV is electrically coupled to the first portion of the TSV.

One aspect of the present disclosure pertains to a structure. The structure includes a substrate that contains a semiconductive material. The structure includes a plurality of transistors formed over a front side of the substrate. The structure includes a solid conductive structure that extends vertically through the substrate. The solid conductive structure is laterally spaced apart from the transistors. The structure includes a plurality of metal layers formed over the front side of the substrate. The metal layers are stacked vertically over one another. Each of the metal layers includes a first region and a second region that is laterally spaced apart from the first region. The metal layers in the first region are vertically aligned with, and electrically coupled to, the transistors. The metal layers in the second region are vertically aligned with, and electrically coupled to, the solid conductive structure.

Yet another aspect of the present disclosure pertains to a method. A plurality of transistors is formed over a first side of a substrate. A multi-layer interconnect structure is formed over the first side of the substrate. The interconnect structure includes a plurality of metal layers interconnected together by a plurality of vias. A first region of the multi-layer interconnect structure is formed over the transistors. A second region of the multi-layer interconnect structure is laterally separated from the first region by a non-conductive material. After the multi-layer interconnect structure has been formed, a thickness of the substrate is reduced. After the thickness of the substrate has been reduced, an opening is etched from a second side of the substrate toward the first side. The opening is etched until a portion of the multi-layer interconnect structure in the second region is exposed. The opening is filled with a conductive material. A through-substrate via (TSV) is formed collectively by the conductive material and the second region of the multi-layer interconnect structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
a substrate;
a multi-layer interconnect structure disposed over a first side of the substrate in a vertical direction, wherein the multi-layer interconnect structure includes a plurality of metal layers;
a first portion of a through-substrate via (TSV) disposed over the first side of the substrate in the vertical direction, wherein the first portion of the TSV includes a plurality of conductive components belonging to the plurality of metal layers of the multi-layer interconnect structure; and
a second portion of the TSV that extends through the substrate in the vertical direction from the first side to a second side opposite the first side, wherein the second portion of the TSV is electrically coupled to the first portion of the TSV, and wherein the second portion of the TSV is aligned with the first portion of the TSV in the vertical direction.

2. The device of claim 1, wherein:
the conductive components of the first portion of the TSV include a plurality of metal lines and a plurality of conductive vias; and
the conductive vias are disposed between the metal lines vertically and electrically connect the metal lines with one another.

3. The device of claim 2, wherein:
the conductive components of the first portion of the TSV further include a plurality of barrier layers; and
each of the barrier layers is disposed at a bottom surface of a respective one of the metal lines.

4. The device of claim 2, wherein:
the metal lines have a first average lateral dimension;
the conductive vias have a second average lateral dimension; and
a ratio of the first average lateral dimension and the second average lateral dimension is in a range between about 1:1 and about 1.5:1.

5. The device of claim 2, wherein the metal lines includes a plurality of lateral protrusions, respectively, wherein each of the lateral protrusions protrude laterally beyond the conductive vias disposed between the metal lines in a cross-sectional view.

6. The device of claim 5, further comprising a non-conductive material disposed over the first side of the substrate, wherein the non-conductive material is disposed above and below each of the lateral protrusions of the metal lines.

7. The device of claim 1, wherein the first portion of the TSV is wider than the second portion of the TSV, such that a first side surface of the first portion of the TSV protrudes beyond a first side surface of the second portion of the TSV laterally, a second side surface of the first portion of the TSV protrudes beyond a second side surface of the second portion of the TSV laterally, wherein the first side surface of the first portion of the TSV is opposite the second side surface of the first portion of the TSV, and wherein the first side surface of the second portion of the TSV is opposite the second side surface of the second portion of the TSV.

8. The device of claim 1, wherein the first portion of the TSV has a mesh structure.

9. The device of claim 8, wherein:
the mesh structure includes at least a first metal layer and a second metal layer;
the first metal layer is disposed closer to the second portion of the TSV than the second metal layer;
the first metal layer includes a plurality of first metal lines each having a first lateral dimension and separated from adjacent ones of the first metal lines by a first spacing;
the second metal layer includes a plurality of second metal lines each having a second lateral dimension and separated from adjacent ones of the second metal lines by a second spacing; and
the first lateral dimension is smaller than the second lateral dimension, or the first spacing is smaller than the second spacing.

10. The device of claim 9, wherein the mesh structure is defined at least in part by a plurality of concentric circular structures or a plurality of rectangular structures in a top view.

11. A structure, comprising:

a substrate that contains a semiconductive material;

a plurality of transistors formed over a front side of the substrate;

a solid conductive structure that extends vertically through the substrate, wherein the solid conductive structure is laterally spaced apart from the transistors; and a plurality of metal layers formed over the front side of the substrate;

wherein:

the metal layers are stacked vertically over one another;

each of the metal layers includes a first region and a second region that is laterally spaced apart from the first region;

the metal layers in the first region are vertically aligned with, and electrically coupled to, the transistors; and the metal layers in the second region are vertically aligned with, and electrically coupled to, the solid conductive structure.

12. The structure of claim 11, wherein at least some of the metal layers in the second region have a mesh structure.

13. The structure of claim 12, wherein at least some of the metal layers in the mesh structure have different pitches from other metal layers in the mesh structure.

14. The structure of claim 11, wherein:

each of the metal layers in the second region has a continuous structure; and each of the metal layers is wider than the solid conductive structure in a cross-sectional view.

15. A device, comprising:

a substrate;

a multi-layer interconnect structure disposed over a first side of the substrate in a vertical direction in a cross-sectional side view, wherein the multi-layer interconnect structure includes a stack of interconnect elements and a stack of conductive vias disposed between the interconnect elements in the vertical direction in the cross-sectional side view, wherein the interconnect elements are aligned with one another, and wherein the conductive vias are aligned with one another in the cross-sectional side view; and a single piece of conductive material that extends through the substrate in the vertical direction in the cross-sectional side view, wherein the single piece of conductive material is electrically coupled to, and aligned with, one of the interconnect elements in the vertical direction, wherein the single piece of conductive material has a smaller lateral dimension than at least one of the conductive vias in the cross-sectional side view.

16. The device of claim 15, wherein at least one of the interconnect elements is at least partially surrounded by a barrier layer.

17. The device of claim 15, wherein an average lateral dimension of the stack of interconnect elements is greater than an average lateral dimension of the stack of conductive vias.

18. The device of claim 15, wherein the interconnect elements and the conductive vias have a same geometric shape in a top view.

19. The device of claim 15, wherein at least one of the interconnect elements or at least one of the conductive vias has a mesh structure in a top view.

20. The device of claim 19, wherein the mesh structure comprises a plurality of concentric circles or a plurality of concentric rectangles in the top view.

* * * * *